US012507530B2

(12) United States Patent

Lv et al.

(10) Patent No.: US 12,507,530 B2

(45) Date of Patent: Dec. 23, 2025

(54) DISPLAY DEVICE AND DRIVING TOOL

(71) Applicants: CHONGQING BOE DISPLAY TECHNOLOGY CO., LTD., Chongqing (CN); BOE Technology Group Co., Ltd., Beijing (CN)

(72) Inventors: Tong Lv, Beijing (CN); Dongyu Gao, Beijing (CN); Xunfei Tong, Beijing (CN); Han Nie, Beijing (CN); Gen Zhao, Beijing (CN); Yingxiong Deng, Beijing (CN); Chengji Deng, Beijing (CN); Liu He, Beijing (CN); Jingwei Huang, Beijing (CN); Jia Chen, Beijing (CN); Xingzong Jiang, Beijing (CN); Chunmei Yang, Beijing (CN); Ling Du, Beijing (CN)

(73) Assignees: Chongqing BOE Display Technology Co., Ltd., Chongqing (CN); Beijing BOE Technology Development Co., Ltd., Beijing (CN)

( * ) Notice: Subject to any disclaimer, the term of this patent is extended or adjusted under 35 U.S.C. 154(b) by 65 days.

(21) Appl. No.: 18/578,166

(22) PCT Filed: Apr. 3, 2023

(86) PCT No.: PCT/CN2023/085993

§ 371 (c)(1),
(2) Date: Jan. 10, 2024

(87) PCT Pub. No.: WO2024/207152

PCT Pub. Date: Oct. 10, 2024

(65) Prior Publication Data

US 2025/0234705 A1 Jul. 17, 2025

(51) Int. Cl.
*H10K 59/121* (2023.01)
*G09G 3/3233* (2016.01)

(52) U.S. Cl.
CPC ....... *H10K 59/1213* (2023.02); *G09G 3/3233* (2013.01); *G09G 2300/0842* (2013.01); *G09G 2320/041* (2013.01); *G09G 2320/043* (2013.01)

(58) Field of Classification Search
CPC .. H10K 59/1213; H10K 59/12; G09G 3/3233; G09G 2300/0842; G09G 2320/041; G09G 2320/043
See application file for complete search history.

(56) References Cited

U.S. PATENT DOCUMENTS

2018/0048849 A1* 2/2018 Dunn ..................... H04N 5/63
2019/0024855 A1* 1/2019 Mochida ........... G02B 19/0061
(Continued)

FOREIGN PATENT DOCUMENTS

CN 101814435 A * 8/2010
CN 104732919 A * 6/2015 .............. G09G 3/20
(Continued)

*Primary Examiner* — Stacy Khoo
(74) *Attorney, Agent, or Firm* — WHDA, LLP

(57) ABSTRACT

A display device includes a substrate and a plurality of sub-pixels arranged in an array on the substrate, and each of the plurality of sub-pixels includes: a drive unit including a driving transistor and a storage capacitor that are electrically connected; light-emitting devices including a pixel opening region, an orthographic projection of the pixel opening region on the substrate and an orthographic projection of the driving transistor on the substrate are at least partially non overlapping, and the orthographic projection of the pixel opening region on the substrate and an orthographic projection of the storage capacitor on the substrate are at least partially non overlapping; wherein the display device is configured as that, after continuously displaying a white picture at room temperature for two hours, a temperature rise of a display surface of the display device is less than or equal to 15° C.

19 Claims, 9 Drawing Sheets

(56) References Cited

U.S. PATENT DOCUMENTS

| | | | | |
|---|---|---|---|---|
| 2020/0350375 | A1 | 11/2020 | Zhu et al. | |
| 2021/0134227 | A1* | 5/2021 | Im | G09G 3/3266 |
| 2021/0193766 | A1 | 6/2021 | Liu et al. | |
| 2021/0202599 | A1 | 7/2021 | Kristal et al. | |
| 2022/0336756 | A1* | 10/2022 | Dai | H10K 85/6572 |

FOREIGN PATENT DOCUMENTS

| | | | | | |
|---|---|---|---|---|---|
| CN | 110061044 | A | | 7/2019 | |
| CN | 209607391 | U | * | 11/2019 | |
| CN | 111490068 | A | | 8/2020 | |
| CN | 114725128 | A | | 7/2022 | |
| CN | 115633521 | A | | 1/2023 | |
| WO | WO-2022082703 | A1 | * | 4/2022 | G09G 3/3233 |

* cited by examiner

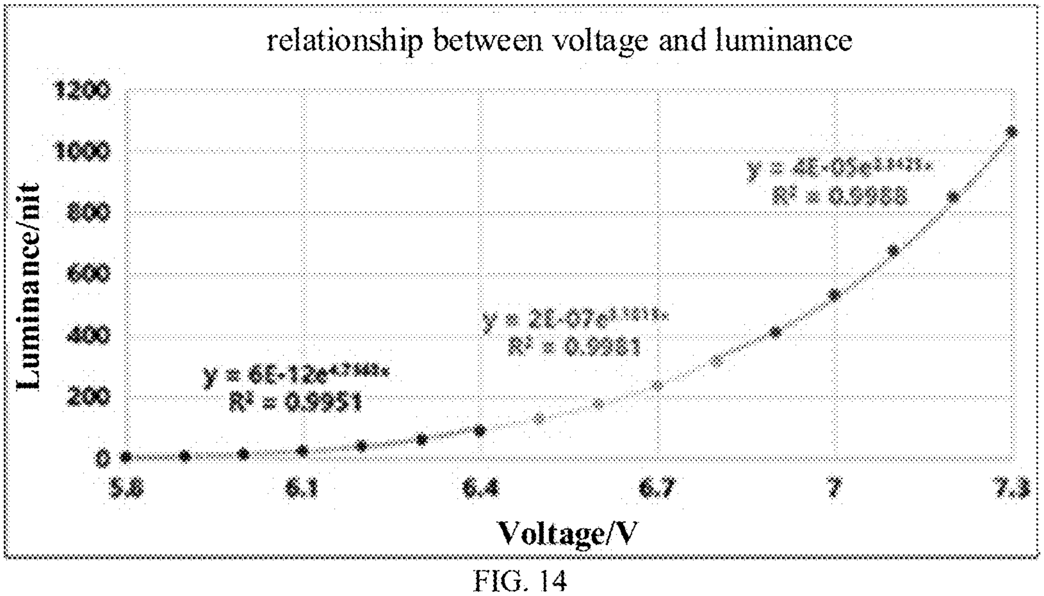
FIG. 14
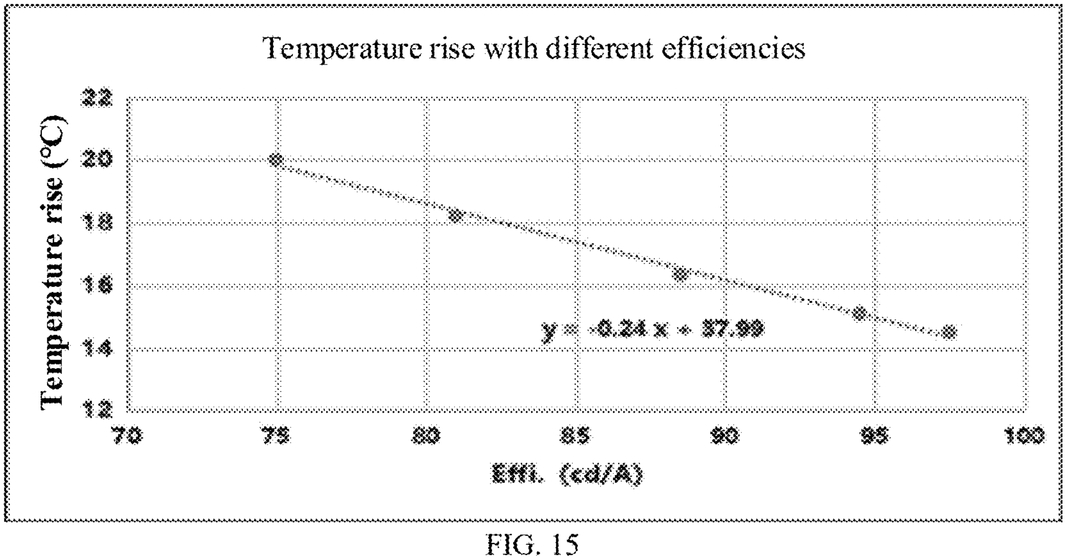
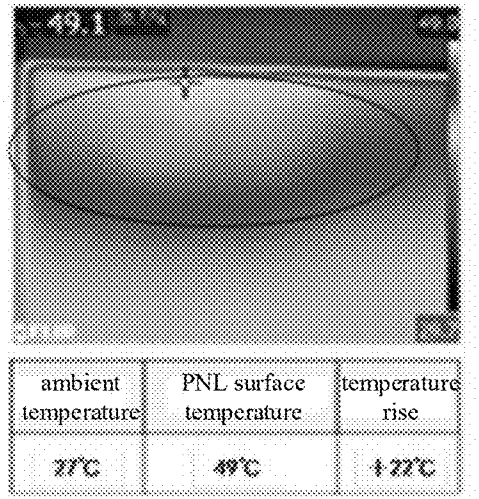
| ambient temperature | PNL surface temperature | temperature rise |
|---|---|---|
| 27°C | 49°C | +22°C |
FIG. 16

DISPLAY DEVICE AND DRIVING TOOL

TECHNICAL FIELD

The present application relates to the technical field of displaying and more particularly, to a display device and a driving tool.

BACKGROUND

OLED (Organic Light-Emitting Diode) displays are widely used in display products such as smartphones and laptops due to their advantages such as high color gamut, high contrast, and flexibility. In addition, with the development of the automotive industry, the OLED displays have also attracted attention from the vehicle display industry due to their excellent display effects. Many car models use displays as display solutions for digital instruments and large screen central control, which can bring users a better interactive experience.

SUMMARY

The present application employs the following technical solutions:

in a first aspect, embodiments of the present application provide a display device, the display device includes a substrate and a plurality of sub-pixels arranged in an array on the substrate, and each of the plurality of sub-pixels includes:

a drive unit located at one side of the substrate, where the drive unit includes a driving transistor and a storage capacitor that are electrically connected;

light-emitting devices electrically connected to the drive unit, where each of the light-emitting devices includes a pixel opening region, an orthographic projection of the pixel opening region on the substrate and an orthographic projection of the driving transistor on the substrate are at least partially non overlapping, and the orthographic projection of the pixel opening region on the substrate and an orthographic projection of the storage capacitor on the substrate are at least partially non overlapping; and the display device is configured as that, after continuously displaying a white picture at room temperature for two hours, a temperature rise of a display surface of the display device is less than or equal to 15° C.; a luminance of a light source of the display device is greater than or equal to 500 nit.

In the display device provided by at least one embodiment of the present application, the driving transistor includes an active layer, and the orthographic projection of the pixel opening region on the substrate and an orthographic projection of the active layer of the driving transistor on the substrate are at least partially non overlapping.

In the display device provided by at least one embodiment of the present application, the driving transistor includes a gate, and the orthographic projection of the pixel opening region on the substrate and an orthographic projection of the gate of the driving transistor on the substrate are at least partially non overlapping.

In the display device provided by at least one embodiment of the present application, the light-emitting devices include a plurality of light-emitting device groups, and each of the plurality of light-emitting device groups includes a first light-emitting device, a second light-emitting device and a third light-emitting device;

the first light-emitting device and the second light-emitting device are located in the same row and are arranged alternately, and a shape formed by connecting lines of geometric centers of the pixel opening regions of the first light-emitting device, the second light-emitting device and the third light-emitting device is a triangle; or the first light-emitting device, the second light-emitting device and the third light-emitting device are arranged in sequence and are located in the same row, the pixel opening region of the second light-emitting device includes two parts that are not connected, the geometric centers of the pixel opening regions of the first light-emitting device, the second light-emitting device and the third light-emitting device are collinear.

In the display device provided by at least one embodiment of the present application, the orthographic projection of the pixel opening region of the light-emitting device on the substrate and the orthographic projection of the gate of the driving transistor on the substrate are roughly non overlapping.

In the display device provided by at least one embodiment of the present application, a plurality of light-emitting device groups extending along a first direction form a row, the gates of the driving transistors are all located between two adjacent rows of the light-emitting device groups, an arrangement direction of the gates of the driving transistors electrically connected to the light-emitting device groups of the same row is consistent with the first direction.

In the display device provided by at least one embodiment of the present application, under the condition that the first light-emitting device and the second light-emitting device are located in the same row and are arranged alternately, a range of a percentage of an area of a region, where the orthographic projection of the pixel opening region of the light-emitting device on the substrate overlaps with an orthographic projection of other regions of the driving transistor except for the gate on the substrate, to an area of the pixel opening region is 17%~37%;

a range of a percentage of an area of a region, where the orthographic projection of the pixel opening region of the light-emitting device on the substrate overlaps with an orthographic projection of the storage capacitor on the substrate, to the area of the pixel opening region is 17%~37%.

In the display device provided by at least one embodiment of the present application, under the condition that the first light-emitting device, the second light-emitting device and the third light-emitting device are arranged in sequence and are located in the same row, and the pixel opening region of the second light-emitting device includes two parts that are not connected, a range of a percentage of an area of a region, where the orthographic projection of the pixel opening region of the light-emitting device on the substrate overlaps with an orthographic projection of other regions of the driving transistor except for the gate on the substrate, to an area of the pixel opening region is 24%~44%;

a range of a percentage of an area of a region, where the orthographic projection of the pixel opening region of the light-emitting device on the substrate overlaps with an orthographic projection of the storage capacitor on the substrate, to the area of the pixel opening region is 24%~44%.

In the display device provided by at least one embodiment of the present application, the orthographic projections of the pixel opening regions of a part of the light-emitting devices on the substrate partially overlap with the orthographic projection of the gate of the driving transistor on the substrate, and the orthographic projections of the pixel opening regions of another part of the light-emitting devices on the substrate and the orthographic projection of the gate of the driving transistor on the substrate are roughly non overlapping.

In the display device provided by at least one embodiment of the present application, under the condition that the first light-emitting device and the second light-emitting device are located in the same row and are arranged alternately, an orthographic projection of the pixel opening region of the third light-emitting device on the substrate partially overlaps with the orthographic projection of the gate of the driving transistor on the substrate, and the orthographic projections of the pixel opening regions of the first light-emitting device and the second light-emitting device on the substrate and the orthographic projection of the gate of the driving transistor on the substrate are roughly non overlapping;

the orthographic projection of the gates of a part of the driving transistors on the substrate are located in a region between the orthographic projections of the pixel opening regions of the first light-emitting device and the second light-emitting device on the substrate.

In the display device provided by at least one embodiment of the present application, under the condition that the first light-emitting device, the second light-emitting device and the third light-emitting device are arranged in sequence and are located in the same row, and the pixel opening region of the second light-emitting device includes two parts that are not connected, an orthographic projection of the pixel opening region of the third light-emitting device on the substrate partially overlaps with the orthographic projection of the gate of the driving transistor on the substrate, an orthographic projection of the pixel opening region of the first light-emitting device on the substrate partially overlaps with the orthographic projection of the gate of the driving transistor on the substrate, and the orthographic projections of the pixel opening regions of the second light-emitting device on the substrate and the orthographic projection of the gate of the driving transistor on the substrate are roughly non overlapping;

the orthographic projection of the gates of a part of the driving transistors on the substrate are located in a region between the orthographic projections of the two parts of the pixel opening region of the second light-emitting device on the substrate.

In the display device provided by at least one embodiment of the present application, a ratio range of areas of the pixel opening regions of the first light-emitting device, the second light-emitting device and the third light-emitting device is (1):(1~2.5):(1.5~3.5).

In the display device provided by at least one embodiment of the present application, luminance of the light-emitting device and a driving voltage of the drive unit satisfy a following functional relationship:

$Y=5E-14*X^{18.851}$, where X represents the driving voltage, Y represents the luminance, a value range of X includes 4V~8V, and the driving voltage is a voltage applied to an anode of the light-emitting device.

In the display device provided by at least one embodiment of the present application, luminance of the light-emitting device and a driving voltage of the drive unit satisfy a following piecewise function relationship:

$Y=6E-12*e^{4.7563X}$, a value range of X includes 5.8V~6.4V;

$Y=2E-7*e^{3.1015X}$, the value range of X includes 6.4V~6.8V;

$Y=4E-5*e^{2.3425X}$, the value range of X includes 6.8V~7.3V; where X represents the driving voltage, Y represents the luminance, and the driving voltage is a voltage applied to an anode of the light-emitting device.

In the display device provided by at least one embodiment of the present application, the display device is configured as that a ratio of minimum luminance to maximum luminance in a white picture is greater than or equal to 80%.

In the display device provided by at least one embodiment of the present application, a range of white light efficiency of the display device is 60 cd/A~130 cd/A, and the white light efficiency refers to luminous efficiency of lights emitted by the first light-emitting device, the second light-emitting device and the third light-emitting device after mixing colors.

In the display device provided by at least one embodiment of the present application, the light-emitting device further includes a cathode, a material of the cathode includes magnesium silver alloy, and a ratio range of magnesium and silver is 1:9~1:20.

In the display device provided by at least one embodiment of the present application, the drive unit includes a source-drain metal layer, the source-drain metal layer includes a source and a drain of the driving transistor, a plurality of signal lines and a plurality of connecting wirings; where a thickness range of the source-drain metal layer along a direction perpendicular to the substrate is 600 nm~1000 nm.

In the display device provided by at least one embodiment of the present application, the display device further includes a printed circuit board and a control board, the printed circuit board and the control board are electrically connected to the drive unit, and both orthographic projections of the printed circuit board and the control board on the substrate do not overlap with an orthographic projection of the light-emitting device on the substrate.

In the display device provided by at least one embodiment of the present application, the display device further includes a backsheet, a thermal conductive bonding layer, a graphene heat sink and a liquid-cooled heat dissipation layer; the backsheet is located at a side of the substrate away from the drive unit, the thermal conductive bonding layer is located at a side of the backsheet away from the substrate, the graphene heat sink is located at a side of the thermal conductive bonding layer away from the substrate, the liquid-cooled heat dissipation layer is located at a side of the graphene heat sink away from the substrate, and the liquid-cooled heat dissipation layer includes at least one of mineral oil and hydrofluoroether.

In a second aspect, embodiments of the present application provide a driving tool, the driving tool includes the display device according to any one of the first aspect, the driving tool further includes an air-cooled radiator, and the air-cooled radiator is located at a side of the display device away from the display surface.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the related art, the figures that are required to describe the embodiments or the related art will be briefly described below. Apparently, the figures that are described below are embodiments of the present application, and a person skilled in the art can obtain other figures according to these figures without paying creative work.

FIG. 14 is a curve chart of a voltage and luminance of another light-emitting device according to an embodiment of the present application;

FIG. 15 is a linear relationship diagram between white luminous efficiency and a temperature rise of a display device according to an embodiment of the present application;

FIG. 16 is an infrared thermal imaging picture of a display surface of a display device in related art;

DETAILED DESCRIPTION

Figure 1:
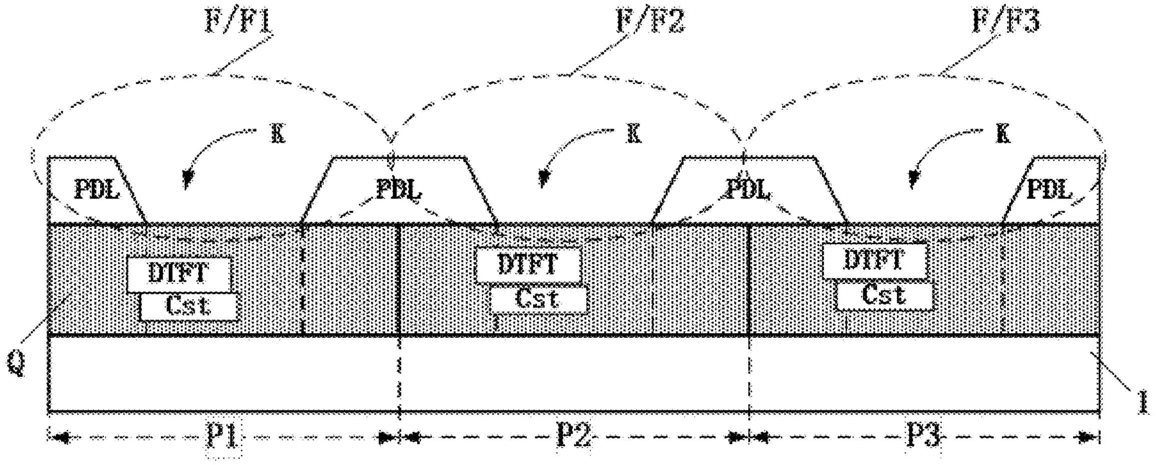
FIG. 1 to FIG. 3 are schematic structural diagrams of three types of display devices according to embodiments of the present application.

The technical solutions according to the embodiments of the present application will be clearly and completely described below with reference to the drawings according to the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

Unless the context otherwise requires, in the entire specification and claims, the term "including/comprising" is interpreted as open and inclusive, meaning "including, but not limited to". In the description of the specification, the terms "one embodiment", "some embodiments", "exemplary embodiments", "examples", "specific examples" or "some examples" etc. are intended to indicate that specific features, structures, materials, or features related to the embodiment or example are included in at least one embodiment or example of the present application. The schematic representation of the above terms may not necessarily refer to the same embodiment or example. Furthermore, the specific features, structures, materials, or features may be included in any one or more embodiments or examples in any appropriate manner.

The features used in the embodiments of the present application, such as "parallel", "vertical", and "identical", all include strictly defined features such as "parallel", "vertical", and "identical", as well as situations where "roughly parallel", "roughly vertical", and "roughly identical" contain certain errors. Considering measurement and errors related to measurement of specific quantities (such as limitations of measurement systems), they represent the acceptable deviation range for a specific value determined by a person skilled in the art. For example, "roughly" can be expressed within one or more standard deviations, or within 10% or 5% of the value. "At least one" refers to one or more, and "a plurality of" refers to at least two.

The term "the same layer" in the embodiment of the present application refers to the relationship between a plurality of film layers formed by the same material after undergoing the same step (such as a one-step patterning process). The term "the same layer" here does not always refer to the plurality of film layers with the same thickness or the plurality of film layers with the same height in the cross-sectional view. The polygons in the specification are not strictly defined, but can be approximate triangles, parallelograms, trapezoids, pentagons, or hexagons, and may have some small deformations caused by tolerances.

In recent years, organic electroluminescent displays, such as OLED (Organic Light-emitting Diode) displays, have gradually received more attention as a new type of flat panel display. Due to its characteristics such as active emission, high brightness, high resolution, wide viewing angle, fast response speed, low energy consumption, and flexibility, it has become a popular mainstream display product in the current market.

For OLED displays used in outdoor or vehicle displays, due to their unique application scenario requirements, the current market tends to favor products with large-sized and high brightness. However, display products with large-sized and high brightness are accompanied by serious heat dissipation problems, especially for outdoor or vehicle display products. Working at high temperatures (relative to the room temperature) will accelerate product aging and seriously reduce its service life.

Based on this, the embodiments of the present application provide a display device and a driving device. The display device includes a substrate and a plurality of sub-pixels arranged in an array on the substrate, and each of the plurality of sub-pixels includes: a drive unit located at one side of the substrate, where the drive unit includes a driving transistor and a storage capacitor that are electrically connected; light-emitting devices electrically connected to the drive unit, where each of the light-emitting devices includes a pixel opening region, an orthographic projection of the pixel opening region on the substrate and an orthographic projection of the driving transistor on the substrate are at least partially non overlapping, and the orthographic projection of the pixel opening region on the substrate and an orthographic projection of the storage capacitor on the substrate are at least partially non overlapping. Among them, the display device is configured as that, after continuously displaying a white picture at room temperature for two hours, a temperature rise of a display surface of the display device is less than or equal to 15° C.; and a luminance of a light source of the display device is greater than or equal to 500 nit. In the display device provided by the embodiment of the present application, since the pixel opening region is a region where the display light is emitted (for example, the pixel opening region is an actual illuminated region) and heat will be generated, by setting that the orthographic projection of the pixel opening region on the substrate and the orthographic projection of the driving transistor on the substrate are at least partially non overlapping, and setting that the orthographic projection of the pixel opening region on the substrate and the orthographic projection of the storage capacitor on the substrate are at least partially non overlapping, the driving transistor and the storage capacitor may be away from the pixel opening region as much as possible, thus avoiding the phenomenon of local heat concentration in the display device as much as possible, which improves the heat dissipation performance of the display device. After continuously displaying the white picture at the room temperature for two hours, the temperature rise of the display surface is less than or equal to 15° C., thereby delaying its aging and extending its service life.

The following will provide a specific description to the embodiments of the present application in conjunction with the accompanying drawings.

Figure 2:
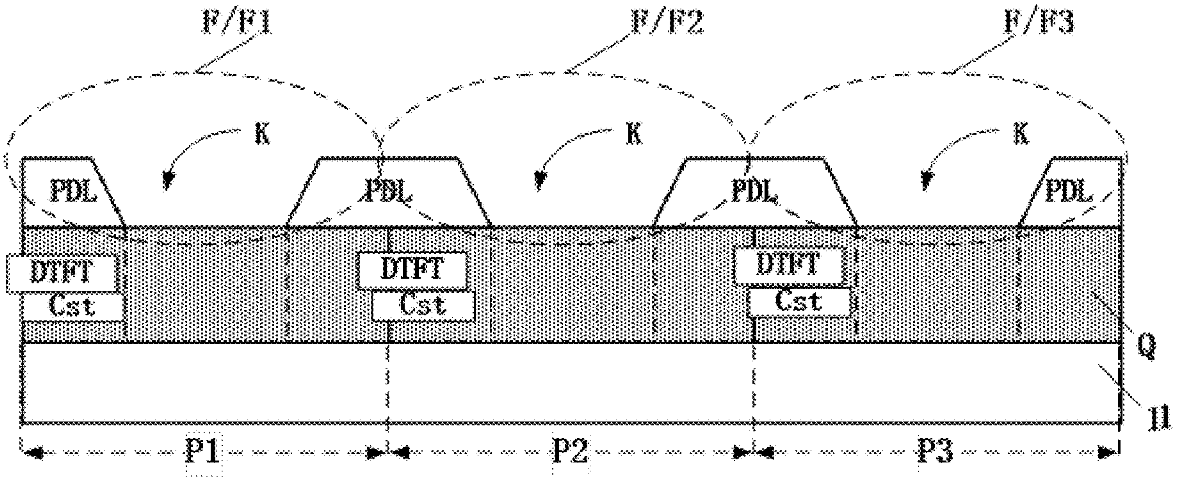
Figure 3:
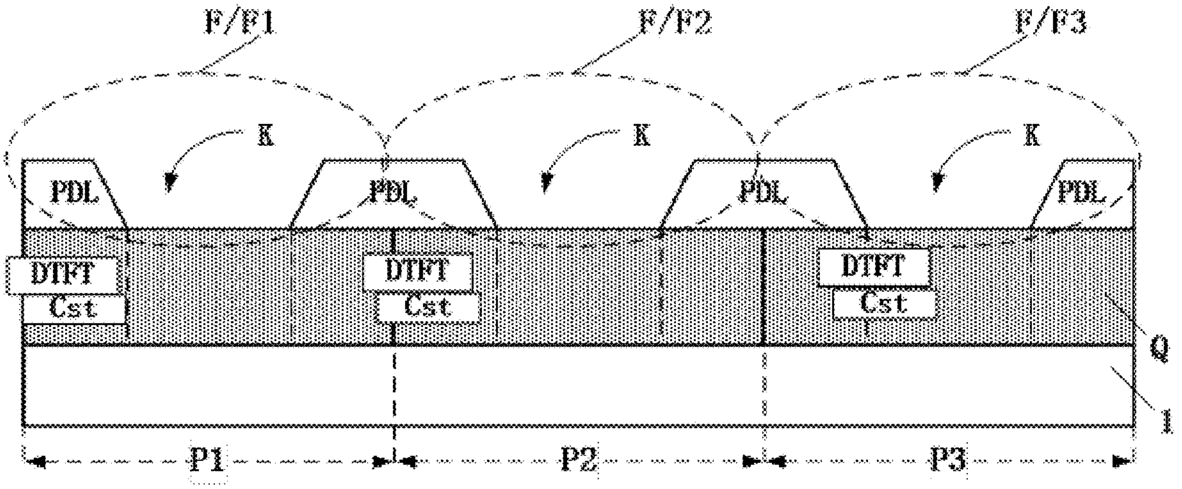

The embodiment of the present application provides a display device that can be applied to outdoor display or vehicle display. As shown in FIG. 1 to FIG. 3, the display device includes a substrate 1 and a plurality of sub-pixels P (such as a sub-pixel P1, a sub-pixel P2, and a sub-pixel P3) arranged in an array on the substrate 1, and each of the plurality of sub-pixels includes:

- a drive unit Q located at one side of the substrate 1, where the drive unit Q includes a driving transistor DTFT and a storage capacitor Cst that are electrically connected;
- light-emitting devices F electrically connected to the drive unit Q, where each of the light-emitting devices F includes a pixel opening region K, an orthographic projection of the pixel opening region K on the substrate 1 and an orthographic projection of the driving transistor DTFT on the substrate 1 are at least partially non overlapping, and the orthographic projection of the pixel opening region K on the substrate 1 and an orthographic projection of the storage capacitor Cst on the substrate 1 are at least partially non overlapping;
- where the display device is configured as that, after continuously displaying a white picture at room temperature for two hours, a temperature rise of a display surface of the display device is less than or equal to 15° C.; where a luminance of a light source of the display device is greater than or equal to 500 nit.

It should be noted that in some embodiments, it may set that among all sub-pixels P, an orthographic projection of the pixel opening region K on the substrate 1 and an orthographic projection of the driving transistor DTFT on the substrate 1 are at least partially non overlapping, and the orthographic projection of the pixel opening region K on the substrate 1 and an orthographic projection of the storage capacitor Cst on the substrate 1 are at least partially non overlapping. Thus, it can achieve a better effect of reducing the temperature risk of the display device, delaying its aging and extending its service life.

Among them, in FIG. 1 to FIG. 3, the light-emitting device F being the OLED light-emitting device is taken an example to draw. In addition, for simplicity, the specific structure of the OLED light-emitting device is omitted, and only the position of the pixel opening region K of the light-emitting device is shown. The specific structure of the OLED light-emitting device can refer to the introduction in related art, and will not be repeated here.

In at least one exemplary embodiment, the above display device may be an OLED display device. Certainly, the above display devices can also be Micro LED display devices (Micro Light-Emitting Diode) or Mini LED display devices (submillimeter light-emitting diode, Mini Light-Emitting Diode). Among them, in the specification and the accompanying drawings the display devices being the OLED display devices are taken as an example to explain and illustrate.

In at least one exemplary embodiment, outdoor display may include advertising screens, billboards, large splicing screens, and the like, which are for outdoor use.

In at least one exemplary embodiment, the vehicle display may include a dashboard, central control screen, display screen on the A-pillar of the vehicle, and the like, which are for vehicle use. Among them, the A-pillar are connecting pillars which are located in the left front and the right front of the vehicle and connect the roof and front cabin, located between the engine compartment and the cockpit, above the left and right rearview mirrors.

In outdoor display or vehicle display, there may be situations where the ambient light brightness is high. Therefore, it is possible to set the luminance of the light source of the display device to be greater than or equal to 500 nit to improve the display effect. For example, the luminance range of the light source of the display device can be set from 600 nit to 1600 nit. For example, the luminance of the light source of the display device can be 700 nit, 800 nit, 900 nit, 1000 nit, 1100 nit, 1200 nit, 1300 nit, 1400 nit and 1500 nit.

In some examples, the material of the substrate 1 may be made of one or more materials including glass, polyimide, polycarbonate, polyacrylate, polyetherimide, and polyethersulfone. The embodiment includes but is not limited to this.

In some examples, the substrate 1 can be a rigid substrate or a flexible substrate;

- when the substrate 1 is the flexible substrate, the substrate 1 can include a single layer of flexible material layer; alternatively, the substrate 1 may include a first flexible material layer, a first inorganic non-metallic material layer, a second flexible material layer, and a second inorganic non-metallic material layer sequentially stacked. Among them, the first flexible material layer and the second flexible material layer are made of materials such as polyimide (PI), polyethylene terephthalate (PET), or surface treated polymer soft films. The first non-metallic material layer and the second inorganic non-metallic material layer are made of materials such as silicon nitride (SiNx) or silicon oxide (SiOx) to improve the water and oxygen resistance of the substrate. The first inorganic non-metallic material layer and the second inorganic non-metallic material layer are also known as barrier layers; and
- when the substrate 1 is the rigid substrate, the substrate 1 can include glass substrate or silicon material substrate.

There are no limitations on the display colors of the sub-pixels mentioned above.

In some embodiments, the display colors of the sub-pixels may be the same. For example, all sub-pixels are displayed in blue, and for another example, all sub-pixels are displayed in white.

In some another embodiments, the display device may include multiple types of sub-pixels with different display colors. For example, the display device may simultaneously include three types of sub-pixels displaying red, blue, and green. For another example, the display device may simultaneously include four types of sub-pixels displaying red, blue, green, and white.

In at least one exemplary embodiment, the drive unit Q includes a pixel driving circuit.

There is no limitation on the specific structure of the pixel driving circuit included in the aforementioned drive unit Q here.

For example, the pixel driving circuit may include a driving module, a storage module, a luminous control module, an initialization module, a reset module, and so on. Among them, the driving module includes a driving transistor DTFT, the storage module includes at least one storage capacitor Cst, and the other modules respectively include at least one switching transistor.

For example, the pixel driving circuit may include structures such as 3TIC, 4T2C, 5T1C, 7TIC, and the like. Taking 3TIC as an example, 3TIC refers to the pixel driving circuit including three transistors and one capacitor.

For example, the orthographic projection of the driving transistor DTFT on the substrate 1 overlaps with the orthographic projection of the storage capacitor Cst on substrate 1.

For example, the gate of driving transistor DTFT can serve as an electrode of the storage capacitor Cst.

There is no limitation on the types of the driving transistors mentioned above. In at least one exemplary embodiment, the aforementioned driving transistors may be thin film transistors (TFT), and in at least another embodiment, the aforementioned transistors may be metal oxide semiconductor field-effect (MOS) transistors.

There is no limitation on the polarity of the aforementioned driving transistors. They can be N-type transistors or P-type transistors.

It should be noted that in the embodiments and accompanying drawings of the present application, the driving transistor being the thin film transistor is taken as an example for illustration and drawing.

The above-mentioned light-emitting device F can include one of OLED light-emitting devices, Mini LED light-emitting devices, and Micro LED light-emitting devices. In the accompanying drawings of the present application, the light-emitting device F is illustrated as an example of OLED light-emitting devices.

Figure 25:
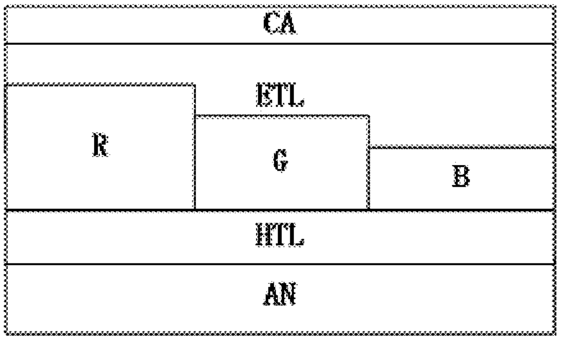
FIG. 25 and FIG. 26 are schematic structural diagrams of two types of light-emitting devices according to embodiments of the present application.
Figure 26:
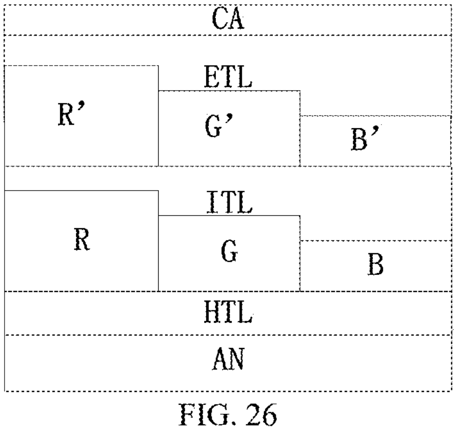

When the light-emitting device F is an OLED light-emitting device, in some embodiments, the OLED light-emitting device may include a layer of luminescent layer EML, for example, as shown in FIG. 25, the light-emitting device may include an anode AN, a hole transport layer HTL, a luminescent layer EML (red luminescent layer R, green luminescent layer G, or blue luminescent layer B), an electron transport layer ETL, and a cathode CA. In other embodiments, the OLED light-emitting device may include two layers of luminescent layer EML, for example, as shown in FIG. 26, the light-emitting device may include the anode AN, the hole transport layer HTL, a first luminescent layer EML1 (red luminescent layer R, green luminescent layer G, or blue luminescent layer B), a charge transport layer (also known as intermediate connecting layer ITL), a second luminescent layer EML2 (red luminescent layer R', green luminescent layer G', or blue luminescent layer B'), an electron transport layer ETL and a cathode CA.

Among them, the materials for the luminescent layer EML can be phosphorescent materials, fluorescent materials, or TADF (thermally activated delayed fluorescence) materials. Currently, phosphorescent materials are commonly used for red and green luminescent materials, while fluorescent materials are commonly used for blue luminescent materials. In addition, red, green and blue luminescent materials can also be added with TADF materials, and TADF materials can enhance luminous efficiency while also enhancing color gamut.

In addition, the OLED light-emitting device of a double-layer (or multi-layer) luminescent layer includes two (multiple) luminescent layers EML, which are connected in series through an intermediate connecting layer ITL. The function of the intermediate connecting layer ITL is to form a PN junction to connect the two luminescent layers EML, thereby reducing the working voltage of the OLED light-emitting device. The current efficiency of the OLED light-emitting device of the double-layer (multi-layer) luminescent layer is higher, and the luminous efficiency will increase by 100% in theory.

For example, the material of the hole transport layer HTL may include aromatic amines materials with hole transport properties, as well as dimethyl fluorene or carbazole materials. For example, 4,4'-bis[N-(1-naphthyl)-N-phenylamino] biphenyl (NPB), N,N'-bis(3-methylphenyl)-N, N'-diphenyl-[1,1'-biphenyl]-4,4'-diamine (TPD), 4-phenyl-4'-(9-phenylfluoren-9-yl)triphenylamine (BAFLP), 4,4'-bis[N-(9, 9-dimethylfluoren-2-yl)-N-phenylamino]biphenyl (DFLDPBi), 4,4'-bis(9-carbazolyl)biphenyl (CBP), 9-phenyl-3-[4-(10-phenyl-9-anthracyl)phenyl]-9H-carbazole (PCzPA).

For example, the material of the electron transport layer ETL may include aromatic heterocyclic compounds, such as benzimidazole derivatives, imidazole derivatives, pyrimidine derivatives, zine derivatives, quinoline derivatives, isoquinoline derivatives, phenanthroline derivatives, and the like.

Certainly, OLED light-emitting devices can also include electron injection layers, hole injection layers, and so on. Please refer to the introduction in related art for details, which will not be repeated here.

The pixel opening region K in the above light-emitting device F refers to the region in sub-pixels (light-emitting devices) where display light is emitted. Taking the light-emitting device F being the OLED light-emitting device as an example, the pixel opening region K in the OLED light-emitting device is the region within the opening of the pixel definition layer PDL. In practical applications, the larger the area of the pixel opening region K, the higher the opening rate of the display device, the higher the transparency of the display device, the better the display effect, and the lower the energy consumption.

In the embodiment of the present application, the orthographic projection of the pixel opening region K on the substrate 1 and the orthographic projection of the driving transistor DTFT on the substrate 1 are at least partially non overlapping, which includes but is not limited to the following situations:

firstly, as shown in FIG. 1, for all sub-pixels, the orthographic projection of the pixel opening region K on the substrate 1 and the orthographic projection of the driving transistor DTFT on the substrate 1 are partially non overlapping, and partially overlap.

Secondly, as shown in FIG. 3, for a first part of sub-pixels (e.g., sub-pixel P3), the orthographic projection of the pixel opening region K on the substrate 1 and the orthographic projection of the driving transistor DTFT on the substrate 1 are partially non overlapping, and partially overlap. For a second part of sub-pixels, the orthographic projection of the pixel opening region K on the substrate 1 and the orthographic projection of the driving transistor DTFT on the substrate 1 are roughly non overlapping. Here, sub-pixels are not limited to only the first part and the second part, and in some embodiments, the third part may also be included.

Thirdly, as shown in FIG. 2, for all sub-pixels, the orthographic projection of the pixel opening region K on the substrate 1 and the orthographic projection of the driving transistor DTFT on the substrate 1 are roughly non overlapping.

In the embodiment of the present application, the orthographic projection of the pixel opening region K on the substrate 1 and the orthographic projection of the storage capacitor Cst on the substrate 1 are at least partially non overlapping, which includes but is not limited to the following situations:

firstly, as shown in FIG. 1, for all sub-pixels, the orthographic projection of the pixel opening region K on the substrate 1 and the orthographic projection of the storage capacitor Cst on the substrate 1 are partially non overlapping, and partially overlap.

Secondly, as shown in FIG. 3, for the first part of sub-pixels (e.g., sub-pixel P3), the orthographic projection of the pixel opening region K on the substrate 1 and the orthographic projection of the storage capacitor Cst on the substrate 1 are partially non overlapping, and partially overlap. For the second part of sub-pixels, the orthographic projection of the pixel opening region K on the substrate 1 and the orthographic projection of the storage capacitor Cst on the substrate 1 are roughly non overlapping. Here, sub-pixels are not limited to only the first part and the second part, and in some embodiments, the third part may also be included.

Thirdly, as shown in FIG. 2, for all sub-pixels, the orthographic projection of the pixel opening region K on the substrate 1 and the orthographic projection of the storage capacitor Cst on the substrate 1 are roughly non overlapping.

It should be noted that the above "roughly" can represent process fluctuations that occur within one or more standard deviations.

In exemplary embodiments, the above "room temperature" refers to a temperature range of 20° C. to 30° C., and for example, the room temperature can be 25° C.±3° C. For example, the room temperature is 23° C., 24° C., 25° C., 26° C., 27° C.

The display surface of the above display device refers to the surface of the display screen, where the display light is emitted.

Among them, the temperature rise of the display surface of the display device refers to, a value of the increased temperature of the display device after continuously displaying the white picture at the room temperature for two hours when the display device is in the ambient temperature (room temperature).

For example, the temperature rise is less than or equal to 15° C., which includes: the temperature rise is equal to 15° C., 14.5° C., 14° C., 13.5° C., 13° C., 12.5° C., 12° C., 11.5° C., 11° C., 10.5° C., 10° C., 9.5° C., and 9° C.

Figure 4:
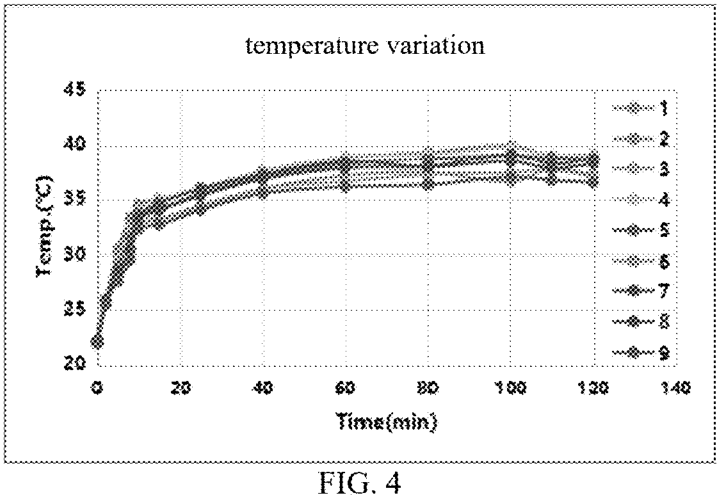
FIG. 4 is a temperature rise curve of the display surface of a display device in related art.

As shown in FIG. 4, the display device in related art continuously displays a white picture at the room temperature for two hours, and the temperature of its display surface approaches 40° C., with the temperature rise of almost 20° C.

Figure 5A:
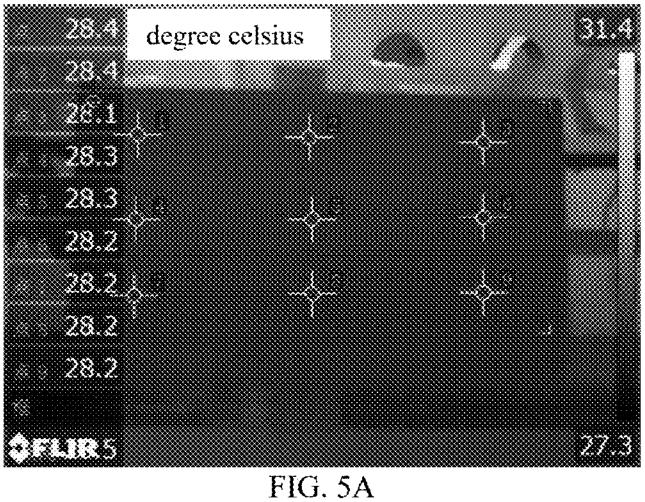
FIG. 5A and FIG. 5B are two infrared thermal imaging pictures of another display device in related art.
Figure 5B:
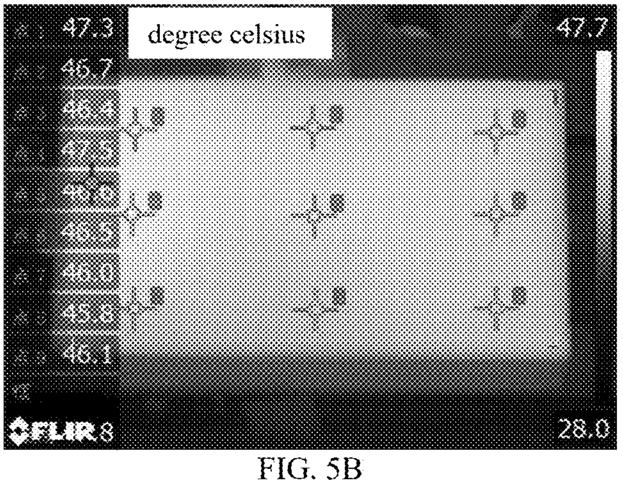

FIG. 5A shows the temperature situation of another display device captured by an infrared thermal imager in the early stage of displaying the white picture. It can be seen that the temperature of the display surface is around 28° C. FIG. 5B shows the temperature situation of another display device captured by an infrared thermal imager in the later stage of displaying the white picture. It can be seen that the temperature of the display surface is around 47° C. Among them, the temperature measured by the infrared thermal imager on the display surface is the average value of the temperatures at 9 positions on the display surface. The temperature rise data provided in the embodiments of the present application can be measured using the infrared thermal imager.

In the display device provided by the embodiment of the present application, since the pixel opening region K is a region where the display light is emitted (for example, the pixel opening region is an actual illuminated region) and heat will be generated, by setting that the orthographic projection of the pixel opening region K on the substrate 1 and the orthographic projection of the driving transistor DTFT on the substrate 1 are at least partially non overlapping, and setting that the orthographic projection of the pixel opening region K on the substrate 1 and the orthographic projection of the storage capacitor Cst on the substrate 1 are at least partially non overlapping, the driving transistor DTFT and the storage capacitor Cst may be away from the pixel opening region K as much as possible, to disperse heat, thus avoiding the phenomenon of local heat concentration in the display device as much as possible, which improves the heat dissipation performance of the display device. After continuously displaying the white picture at the room temperature for two hours, the temperature rise of the display surface is less than or equal to 15° C., thereby delaying its aging and extending its service life.

In the display device provided by at least one embodiment of the present application, the driving transistor DTFT includes an active layer, and the orthographic projection of the pixel opening region K on the substrate 1 and an orthographic projection of the active layer of the driving transistor DTFT on the substrate 1 are at least partially non overlapping.

The transistor refers to a component that includes at least three terminals: gate electrode (also known as gate), drain electrode (also known as drain), and source electrode (also known as source). The transistors have a channel region (active region) between the drain and source, and current can flow through the drain, the channel region, and the source. The channel region is located near the interface between the active layer and gate in the region where the active layer and gate overlap. Note that in the specification, the channel region refers to the region where the current mainly flows.

Among them, the material of the active layer is semiconductor material, and there is no limitation on the specific material type of the active layer mentioned above.

For example, the material of the active layer may include silicon materials, such as polycrystalline silicon (poly Si), monocrystalline silicon (a-Si), and doped silicon.

For example, the material of the active layer may include metal oxides, such as indium gallium zinc oxide (IGZO), indium zinc titanium oxide.

For example, materials of the active layer may include organic semiconductor materials, such as benzene molecules and their derivatives, compounds containing thiophene rings and N-heterocycles and the like.

Among them, the orthographic projection of the pixel opening region K on the substrate 1 and an orthographic projection of the active layer of the driving transistor DTFT on the substrate 1 are at least partially non overlapping, which include but is not limited to the following situations:

firstly, for all sub-pixels, the orthographic projection of the pixel opening region K on the substrate 1 and the orthographic projection of the active layer of the driving transistor DTFT on the substrate 1 are partially non overlapping, and partially overlap.

Secondly, for the first part of sub-pixels, the orthographic projection of the pixel opening region K on the substrate 1 and the orthographic projection of the active layer of the driving transistor DTFT on the substrate 1 are partially non overlapping, and partially overlap. For the second part of sub-pixels, the orthographic projection of the pixel opening region K on the substrate 1 and the orthographic projection of the active layer of the driving transistor DTFT on the substrate 1 are roughly non overlapping. Here, sub-pixels are not limited to only the first part and the second part, and in some embodiments, the third part may also be included.

Thirdly, for all sub-pixels, the orthographic projection of the pixel opening region K on the substrate 1 and the orthographic projection of the active layer of the driving transistor DTFT on the substrate 1 are roughly non overlapping.

In the embodiment of the present application, since the channel region of the transistor is located near the interface between the active layer and gate, and the channel region of the transistor will generate heat, by setting that the orthographic projection of the pixel opening region K on the substrate 1 and the orthographic projection of the active layer of the driving transistor DTFT on the substrate 1 are at least partially non overlapping, the phenomenon of local heat concentration in the display device may be avoided as much as possible, which improves the heat dissipation performance of the display device. After continuously displaying the white picture at the room temperature for two hours, the temperature rise of the display surface is less than or equal to 15° C., thereby delaying its aging and extending its service life.

In the display device provided by at least one embodiment of the present application, the driving transistor DTFT includes a gate, and the orthographic projection of the pixel opening region K on the substrate 1 and an orthographic projection of the gate of the driving transistor DTFT on the substrate 1 are at least partially non overlapping.

The upper and lower positions of the gate and the active layer of the above-mentioned driving transistor are not limited here. In some embodiments, the gate is located between the active layer and the substrate 1. In another embodiments, the gate is located on a side of the active layer away from the substrate 1.

For example, the orthographic projection of the pixel opening region K on the substrate 1 and the orthographic projection of the gate of the driving transistor DTFT on the substrate 1 are at least partially non overlapping, which includes but is not limited to the following situations:

firstly, for all sub-pixels, the orthographic projection of the pixel opening region K on the substrate 1 and the orthographic projection of the gate of the driving transistor DTFT on the substrate 1 are partially non overlapping, and partially overlap.

Secondly, for the first part of sub-pixels, the orthographic projection of the pixel opening region K on the substrate 1 and the orthographic projection of the gate of the driving transistor DTFT on the substrate 1 are partially non overlapping, and partially overlap. For the second part of sub-pixels, the orthographic projection of the pixel opening region K on the substrate 1 and the orthographic projection of the gate of the driving transistor DTFT on the substrate 1 are roughly non overlapping. Here, sub-pixels are not limited to only the first part and the second part, and in some embodiments, the third part may also be included.

Thirdly, for all sub-pixels, the orthographic projection of the pixel opening region K on the substrate 1 and the orthographic projection of the gate of the driving transistor DTFT on the substrate 1 are roughly non overlapping.

In the embodiment of the present application, since the channel region of the transistor is located near the interface between the active layer and gate, and the channel region of the transistor will generate heat, by setting that the orthographic projection of the pixel opening region K on the substrate 1 and the orthographic projection of the gate of the driving transistor DTFT on the substrate 1 are at least partially non overlapping, the phenomenon of local heat concentration in the display device may be avoided as much as possible, which improves the heat dissipation performance of the display device. After continuously displaying the white picture at the room temperature for two hours, the temperature rise of the display surface is less than or equal to 15° C., thereby delaying its aging and extending its service life.

Figure 6:
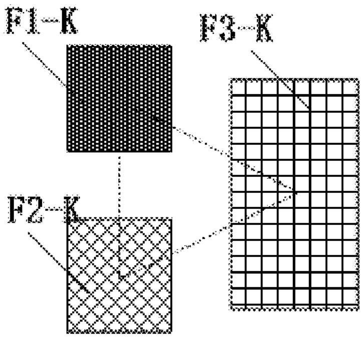
FIG. 6 and FIG. 7 are layout design drawings of two types of light-emitting devices according to embodiments of the present application.
Figure 7:
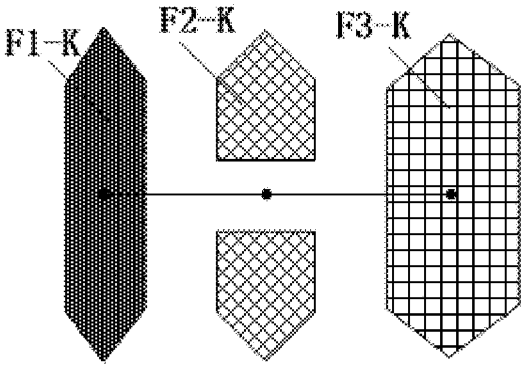
Figure 8:
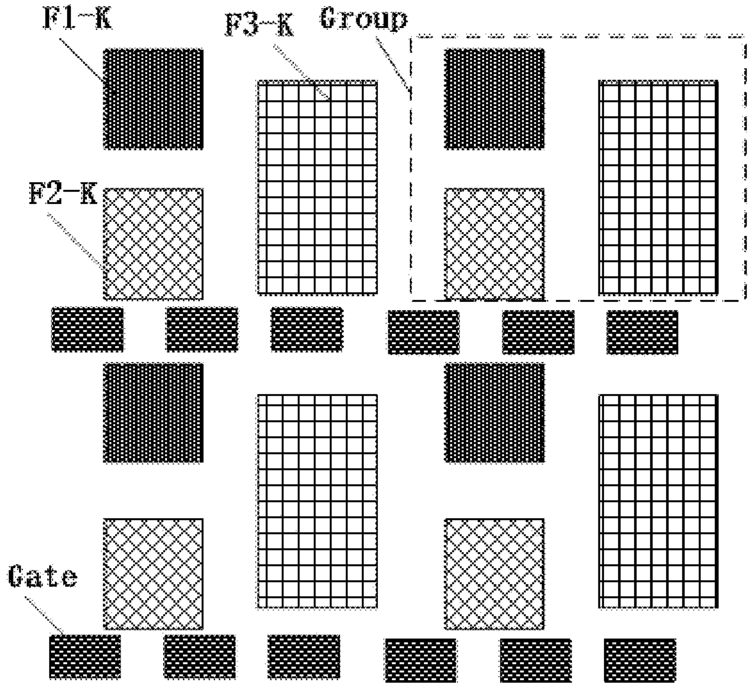
FIG. 8 to FIG. 11 are positional relationship diagrams between the light-emitting devices and gates of driving transistors of four types of display devices according to embodiments of the present application.
Figure 9:
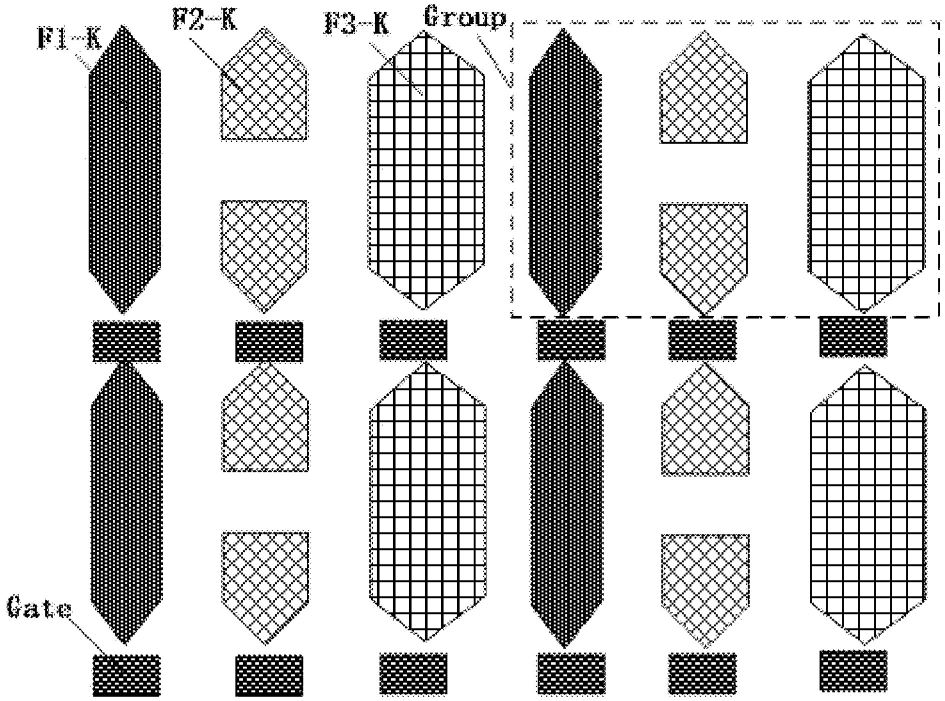

In the display device provided by at least one embodiment of the present application, as shown in FIG. 8 and FIG. 9, the light-emitting devices include a plurality of light-emitting device groups, as shown in FIG. 6 and FIG. 7, each of the plurality of light-emitting device groups includes a first light-emitting device F1, a second light-emitting device F2 and a third light-emitting device F3. Among them, FIG. 6 and FIG. 7 only show the layout of the light-emitting devices in a light-emitting device group.

In exemplary embodiments, the first light-emitting device F1 can be a red light-emitting device, the second light-emitting device F2 can be a green light-emitting device, and the third light-emitting device F3 can be a blue light-emitting device. Certainly, in another embodiments, the first light-emitting device F1 can be the green light-emitting device, the second light-emitting device F2 can be the red light-emitting device, and the third light-emitting device F3 can be the blue light-emitting device. Alternatively, in some other embodiments, the first light-emitting device F1 may be the blue light-emitting device, the second light-emitting device F2 may be the red light-emitting device, and the third light-emitting device F3 may be the green light-emitting device.

Among them, in the embodiments and drawings of the present application, taking the first light-emitting device F1 as the red light-emitting device, the second light-emitting device F2 as the green light-emitting device, and the third light-emitting device F3 as the blue light-emitting device as examples for explanation.

In some embodiments, as shown in FIG. 6, the first light-emitting device F1 and the second light-emitting device F2 are located in the same row and are arranged alternately, and a shape formed by connecting lines of geometric centers of the pixel opening regions K of the first light-emitting device F1, the second light-emitting device F2 and the third light-emitting device F3 is a triangle; or in some other embodiments, as shown in FIG. 7, the first light-emitting device F1, the second light-emitting device F2 and the third light-emitting device F3 are arranged in sequence and are located in the same row, the pixel opening region K of the second light-emitting device F2 includes two parts that are not connected, the geometric centers of the pixel opening regions K of the first light-emitting device F1, the second light-emitting device F2 and the third light-emitting device F3 are collinear.

It should be noted that, in the drawings provided by the present application (for example, in FIG. 6 and FIG. 7), taking the arrangement of the pixel opening region K of each light-emitting device F as an example, to explain the arrangement position of the light-emitting device F.

In the display device provided by at least one embodiment of the present application, as shown in FIG. 8 and FIG. 9, the orthographic projection of the pixel opening region K of the light-emitting device F on the substrate 1 and the orthographic projection of the gate of the driving transistor on the substrate 1 are roughly non overlapping.

It should be noted that, the orthographic projection of the pixel opening region K of the light-emitting device F on the substrate 1 and the orthographic projection of the gate of the driving transistor on the substrate 1 are roughly non overlapping, which includes but is not limited to:

firstly, the orthographic projection of the pixel opening region K of the light-emitting device F on the substrate 1 and the orthographic projection of the gate of the driving transistor on the substrate 1 do not overlap;

secondly, based on the fact that the orthographic projection of the pixel opening region K of the light-emitting device F on the substrate 1 and the orthographic projection of the gate of the driving transistor on the substrate 1 do not overlap, any small overlapping areas between the two orthographic projections caused by process fluctuations are within the aforementioned protection range. For example, there is a fluctuation in the overlapping area that accounts for 3% to 5% of the area of the pixel opening region K.

In the display device provided by at least one embodiment of the present application, a plurality of light-emitting device groups extending along a first direction form a row, the gates of the driving transistors are all located between two adjacent rows of the light-emitting device groups, an arrangement direction of the gates of the driving transistors DTFT electrically connected to the light-emitting device groups of the same row is consistent with the first direction.

In exemplary embodiments, the first direction mentioned above may be the direction of the row. Alternatively, the first direction mentioned above can be the direction along the column.

In exemplary embodiments, as shown in FIG. 8 and FIG. 9, the plurality of light-emitting device groups in the same row form a row, and the gates of the driving transistors are located between two adjacent rows of light-emitting device groups. The arrangement direction of the gates of the driving transistors electrically connected to the same row of light-emitting device groups is the same as the extension direction of light-emitting device groups in this row.

In exemplary embodiments, a plurality of light-emitting device groups in the same column form a row, and the gates of the driving transistors are located between two adjacent columns of light-emitting device groups. The arrangement direction of the gates of the driving transistors electrically connected to the light-emitting device groups in the same column is the same as the extension direction of the light-emitting device group in this column.

In the embodiment of the present application, by setting that the orthographic projection of the pixel opening region K of the light-emitting device F on the substrate 1 and the orthographic projection of the gate of the driving transistor on the substrate 1 are roughly non overlapping, for example, setting that the gates of the driving transistors are located between two adjacent rows of light-emitting device groups, the phenomenon of local heat concentration in the display device may be avoided as much as possible, which improves the heat dissipation performance of the display device. After continuously displaying the white picture at the room temperature for two hours, the temperature rise of the display surface is less than or equal to 15° C., thereby delaying its aging and extending its service life.

According to the different pixel layout design (layout design of the light-emitting devices), there are different requirements for the proportion of the overlapping areas between the driving transistor DTFT and the pixel opening region K of the light-emitting device F and between the storage capacitor Cst and the pixel opening region K of the light-emitting device F. The specific instructions are as follows:

the first scenario, for the layout design of the light-emitting device shown in FIG. 6, the requirement is as follows:

in the display device provided by at least one embodiment of the present application, when the orthographic projection of the pixel opening region K of the light-emitting device F on the substrate 1 and the orthographic projection of the gate of the driving transistor on the substrate 1 are roughly non overlapping, a range of a percentage of an area of a region, where the orthographic projection of the pixel opening region K of the light-emitting device F (including the first light-emitting device F1, the second light-emitting device F2 and the third light-emitting device F3) on the substrate 1 overlaps with an orthographic projection of other regions of the driving transistor DTFT except for the gate on the substrate 1, to an area of the pixel opening region K is 17%~37%.

For example, according to the different sizes of the pixel opening region K of the light-emitting device F, the area of the overlapping region with the orthographic projection of the driving transistor DTFT is different. For example, the larger the size of the pixel opening region K of the light-emitting device F (with a higher opening rate), the greater the possibility or area of overlapping region with the driving transistor DTFT.

For example, for the layout design of the light-emitting device shown in FIG. 6, the percentage of the area of the region, where the orthographic projection of the pixel opening region K of the light-emitting device F on the substrate 1 overlaps with the orthographic projection of other regions of the driving transistor DTFT except for the gate on the substrate 1, to the area of the pixel opening region K may be 17%, 18%, 19%, 20%, 21%, 22%, 23%, 24%, 25%, 26%, 28%, 30%, 32%, 35%, and 37%.

In addition, for the layout design of the light-emitting device shown in FIG. 6, a range of a percentage of an area of a region, where the orthographic projection of the pixel opening region K of the light-emitting device (including the first light-emitting device F1, the second light-emitting device F2 and the third light-emitting device F3) on the substrate 1 overlaps with an orthographic projection of the storage capacitor Cst on the substrate 1, to the area of the pixel opening region K is 17%~37%.

For example, the larger the size of the pixel opening region K of the light-emitting device F (with a higher opening rate), the greater the possibility or area of overlapping region with the storage capacitor Cst.

For example, for the layout design of the light-emitting device shown in FIG. 6, the percentage of the area of the region, where the orthographic projection of the pixel opening region K of the light-emitting device F on the substrate 1 overlaps with the orthographic projection of the storage capacitor Cst on the substrate 1, to the area of the pixel opening region K may be 17%, 18%, 19%, 20%, 21%, 22%, 23%, 24%, 25%, 26%, 28%, 30%, 32%, 35%, and 37%.

In an exemplary embodiment, the orthographic projection of the driving transistor DTFT on the substrate 1 can overlap with the orthographic projection of the storage capacitor Cst on the substrate 1 in the same sub-pixel.

In the layout design of the light-emitting device shown in FIG. 6, there is no limitation on whether the overlapping area of the storage capacitor Cst and the pixel opening region K of the light-emitting device is the same as that of the driving transistor DTFT and the pixel opening region K of the light-emitting device. In some embodiments, in the same sub-pixel, when the orthographic projection of the driving transistor DTFT on the substrate 1 completely overlap with the orthographic projection of the storage capacitor Cst on the substrate 1, the overlapping area of the storage capacitor Cst and the pixel opening region K of the light-emitting device is the same as the overlapping area of the driving transistor DTFT and the pixel opening region K of the light-emitting device F.

In an exemplary embodiment, taking the first light-emitting device F1 in the layout design of the light-emitting device shown in FIG. 6 as an example, a range of a percentage of an area of a region, where the orthographic projection of the pixel opening region F1-K of the first light-emitting device on the substrate 1 overlaps with the orthographic projection of other regions of the driving transistor DTFT except for the gate on the substrate 1, to an area of the pixel opening region F1-K of the first light-emitting device is 17%~37%. The situation of the second light-emitting device F2 and the third light-emitting device F3 is similar to that of the first light-emitting device F1, and will not be repeated here.

It should be noted that in the layout design of the light-emitting device F as shown in FIG. 6, the area of the region where the orthographic projection of the pixel opening region F1-K of the first light-emitting device F1 on the substrate 1 overlaps with the orthographic projection of other regions of the driving transistor DTFT except for the gate on the substrate 1, the area of the region where the orthographic projection of the pixel opening region F2-K of the second light-emitting device F2 on the substrate 1 overlaps with the orthographic projection of other regions of the driving transistor DTFT except for the gate on the substrate 1, and the area of the region where the orthographic projection of the pixel opening region F3-K of the third light-emitting device F3 on the substrate 1 overlaps with the orthographic projection of other regions of the driving transistor DTFT except for the gate on the substrate 1, are not necessarily the same.

For example, when the first light-emitting device F1 is a red light-emitting device, the second light-emitting device F2 is a green light-emitting device, and the third light-emitting device F3 is a blue light-emitting device, if the area of the pixel opening region K of the red light-emitting device is smaller than that of the pixel opening region K of the green light-emitting device, and the area of the pixel opening region K of the green light-emitting device is smaller than that of the pixel opening region K of the blue light-emitting device, the overlapping area of the driving transistor DTFT and the pixel opening region K of the blue light-emitting device is the largest, followed by the green light-emitting device, and that of the red light-emitting device is the smallest.

The size pattern of the overlapping area between the pixel opening region K of different colored light-emitting devices F and the storage capacitor is the same as that of the overlapping area of the pixel opening region K of different colored light-emitting devices and the driving transistor DTFT.

In the embodiment of the present application, for the pixel layout design as shown in FIG. 6, when the pixel opening region K of the light-emitting device F is designed to be away from the gate of the driving transistor DTFT (orthographic projections are roughly non overlapping), by setting that the range of the percentage of the area of the region, where the orthographic projection of the pixel opening region K of the light-emitting device on the substrate 1 overlaps with the orthographic projection of other regions of the driving transistor DTFT except for the gate on the substrate 1, to the area of the pixel opening region K is 17%~37%, and setting that the range of the percentage of the area of the region, where the orthographic projection of the pixel opening region K of the light-emitting device on the substrate 1 overlaps with the orthographic projection of the storage capacitor Cst on the substrate 1, to the area of the pixel opening region K is 17%~37%, the phenomenon of local heat concentration in the display device may be avoided as much as possible, which improves the heat dissipation performance of the display device. After continuously displaying the white picture at the room temperature for two hours, the temperature rise of the display surface is less than or equal to 15° C., thereby delaying its aging and extending its service life.

The second scenario, for the layout design of the light-emitting device shown in FIG. 7, the requirement is as follows:

in the display device provided by at least one embodiment of the present application, when the orthographic projection of the pixel opening region K of the light-emitting device F on the substrate 1 and the orthographic projection of the gate of the driving transistor on the substrate 1 are roughly non overlapping, the range of the percentage of the area of the region, where the orthographic projection of the pixel opening region K of the light-emitting device F on the substrate 1 overlaps with an orthographic projection of other regions of the driving transistor DTFT except for the gate on the substrate 1, to the area of the pixel opening region K is 24%~44%.

For example, according to the different sizes of the pixel opening region K of the light-emitting device F, the area of the overlapping region with the orthographic projection of the driving transistor DTFT is different. For example, the larger the size of the pixel opening region K of the light-emitting device F (with a higher opening rate), the greater the possibility or area of overlapping region with the driving transistor DTFT.

For example, for the layout design of the light-emitting device shown in FIG. 7, the percentage of the area of the region, where the orthographic projection of the pixel opening region K of the light-emitting device F on the substrate 1 overlaps with the orthographic projection of other regions of the driving transistor DTFT except for the gate on the substrate 1, to the area of the pixel opening region K may be 24%, 25%, 28%, 29%, 30%, 32%, 34%, 35%, 38%, 40%, 42%, 44%.

In addition, for the layout design of the light-emitting device shown in FIG. 7, the range of the percentage of the area of the region, where the orthographic projection of the pixel opening region of the light-emitting device on the substrate overlaps with the orthographic projection of the storage capacitor on the substrate, to the area of the pixel opening region is 24%~44%.

For example, the larger the size of the pixel opening region K of the light-emitting device F (with a higher opening rate), the greater the possibility or area of overlapping region with the storage capacitor Cst.

For example, for the layout design of the light-emitting device shown in FIG. 7, the percentage of the area of the region, where the orthographic projection of the pixel opening region K of the light-emitting device on the substrate 1 overlaps with the orthographic projection of the storage capacitor Cst on the substrate 1, to the area of the pixel opening region K may be 24%, 25%, 28%, 29%, 30%, 32%, 34%, 35%, 38%, 40%, 42%, 44%.

In an exemplary embodiment, the orthographic projection of the driving transistor DTFT on the substrate 1 can overlap with the orthographic projection of the storage capacitor Cst on the substrate 1 in the same sub-pixel.

In the layout design of the light-emitting device shown in FIG. 7, there is no limitation on whether the overlapping area of the storage capacitor Cst and the pixel opening region K of the light-emitting device is the same as that of the driving transistor DTFT and the pixel opening region K of the light-emitting device. In some embodiments, in the same sub-pixel, when the orthographic projection of the driving transistor DTFT on the substrate 1 completely overlap with the orthographic projection of the storage capacitor Cst on the substrate 1, the overlapping area of the storage capacitor Cst and the pixel opening region K of the light-emitting device is the same as the overlapping area of the driving transistor DTFT and the pixel opening region K of the light-emitting device F.

In an exemplary embodiment, taking the first light-emitting device F1 in the layout design of the light-emitting device shown in FIG. 7 as an example, a range of a percentage of an area of a region, where the orthographic projection of the pixel opening region F1-K of the first light-emitting device on the substrate 1 overlaps with the orthographic projection of other regions of the driving transistor DTFT except for the gate on the substrate 1, to an area of the pixel opening region F1-K of the first light-emitting device is 24%~44%. The situation of the second light-emitting device F2 and the third light-emitting device F3 is similar to that of the first light-emitting device F1, and will not be repeated here.

It should be noted that in the layout design of the light-emitting device F as shown in FIG. 7, the area of the region where the orthographic projection of the pixel opening region F1-K of the first light-emitting device F1 on the substrate 1 overlaps with the orthographic projection of other regions of the driving transistor DTFT except for the gate on the substrate 1, the area of the region where the orthographic projection of the pixel opening region F2-K of the second light-emitting device F2 on the substrate 1 overlaps with the orthographic projection of other regions of the driving transistor DTFT except for the gate on the substrate 1, and the area of the region where the orthographic projection of the pixel opening region F3-K of the third light-emitting device F3 on the substrate 1 overlaps with the orthographic projection of other regions of the driving transistor DTFT except for the gate on the substrate 1, are not necessarily the same.

For example, when the first light-emitting device F1 is a red light-emitting device, the second light-emitting device F2 is a green light-emitting device, and the third light-emitting device F3 is a blue light-emitting device, if the area of the pixel opening region K of the red light-emitting device is smaller than that of the pixel opening region K of the green light-emitting device, and the area of the pixel opening region K of the green light-emitting device is smaller than that of the pixel opening region K of the blue light-emitting device, the overlapping area of the driving transistor DTFT and the pixel opening region K of the blue light-emitting device is the largest, followed by the green light-emitting device, and that of the red light-emitting device is the smallest.

The size pattern of the overlapping area between the pixel opening region K of different colored light-emitting devices F and the storage capacitor is the same as that of the overlapping area of the pixel opening region K of different colored light-emitting devices and the driving transistor DTFT.

In the embodiment of the present application, for the pixel layout design as shown in FIG. 7, when the pixel opening region K of the light-emitting device F is designed to be away from the gate of the driving transistor DTFT (orthographic projections are roughly non overlapping), by setting that the range of the percentage of the area of the region, where the orthographic projection of the pixel opening region K of the light-emitting device on the substrate 1 overlaps with the orthographic projection of other regions of the driving transistor DTFT except for the gate on the substrate 1, to the area of the pixel opening region K is 24%~44%, and setting that the range of the percentage of the area of the region, where the orthographic projection of the pixel opening region K of the light-emitting device on the substrate 1 overlaps with the orthographic projection of the storage capacitor Cst on the substrate 1, to the area of the pixel opening region K is 24%~44%, the phenomenon of local heat concentration in the display device may be avoided as much as possible, which improves the heat dissipation performance of the display device. After continuously displaying the white picture at the room temperature for two hours, the temperature rise of the display surface is less than or equal to 15° C., thereby delaying its aging and extending its service life.

In the display device provided by at least one embodiment of the present application, the orthographic projections of the pixel opening regions K of a part of the light-emitting devices F on the substrate 1 partially overlap with the orthographic projection of the gate of the driving transistor DTFT on the substrate 1, and the orthographic projections of the pixel opening regions K of another part of the light-emitting devices F on the substrate 1 and the orthographic projection of the gate of the driving transistor DTFT on the substrate 1 are roughly non overlapping.

Taking the light-emitting devices F including the first light-emitting device F1, the second light-emitting device F2 and the third light-emitting device F3 as an example, the orthographic projections of the pixel opening regions K of a part of the light-emitting devices F on the substrate 1 partially overlap with the orthographic projection of the gate of the driving transistor DTFT on the substrate 1, and the orthographic projections of the pixel opening regions K of another part of the light-emitting devices F on the substrate 1 and the orthographic projection of the gate of the driving transistor DTFT on the substrate 1 are roughly non overlapping, which includes but not limited to the following situations:

firstly, the orthographic projections of the pixel opening regions K of a part of the first light-emitting devices F1 on the substrate 1 partially overlap with the orthographic projection of the gate of the driving transistor DTFT on the substrate 1, and the orthographic projections of the pixel opening regions K of another part of the first light-emitting devices F1 on the substrate 1 and the orthographic projection of the gate of the driving transistor DTFT on the substrate 1 are roughly non overlapping;

the orthographic projections of the pixel opening regions K of a part of the second light-emitting devices F2 on the substrate 1 partially overlap with the orthographic projection of the gate of the driving transistor DTFT on the substrate 1, and the orthographic projections of the pixel opening regions K of another part of the second light-emitting devices F2 on the substrate 1 and the orthographic projection of the gate of the driving transistor DTFT on the substrate 1 are roughly non overlapping;

the orthographic projections of the pixel opening regions K of a part of the third light-emitting devices F3 on the substrate 1 partially overlap with the orthographic projection of the gate of the driving transistor DTFT on the substrate 1, and the orthographic projections of the pixel opening regions K of another part of the third light-emitting devices F3 on the substrate 1 and the orthographic projection of the gate of the driving transistor DTFT on the substrate 1 are roughly non overlapping.

Figure 10:
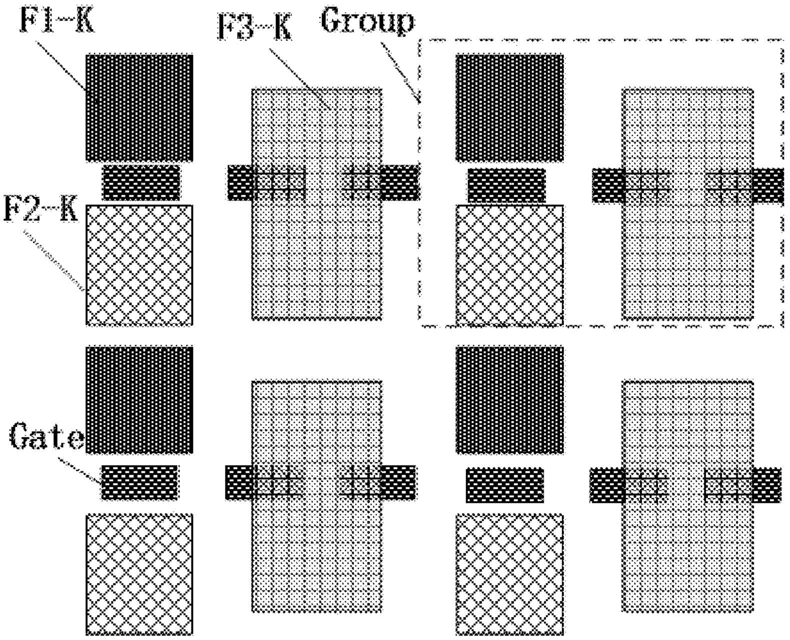

Secondly, as shown in FIG. 10, the orthographic projections of the pixel opening regions K of the first light-emitting devices F1 on the substrate 1 and the orthographic projection of the gate of the driving transistor DTFT on the substrate 1 are roughly non overlapping, the orthographic projections of the pixel opening regions K of the second light-emitting devices F2 on the substrate 1 and the orthographic projection of the gate of the driving transistor DTFT on the substrate 1 are roughly non overlapping, and the orthographic projections of the pixel opening regions K of a part of the third light-emitting devices F3 on the substrate 1 partially overlap with the orthographic projection of the gate of the driving transistor DTFT on the substrate 1.

Figure 11:
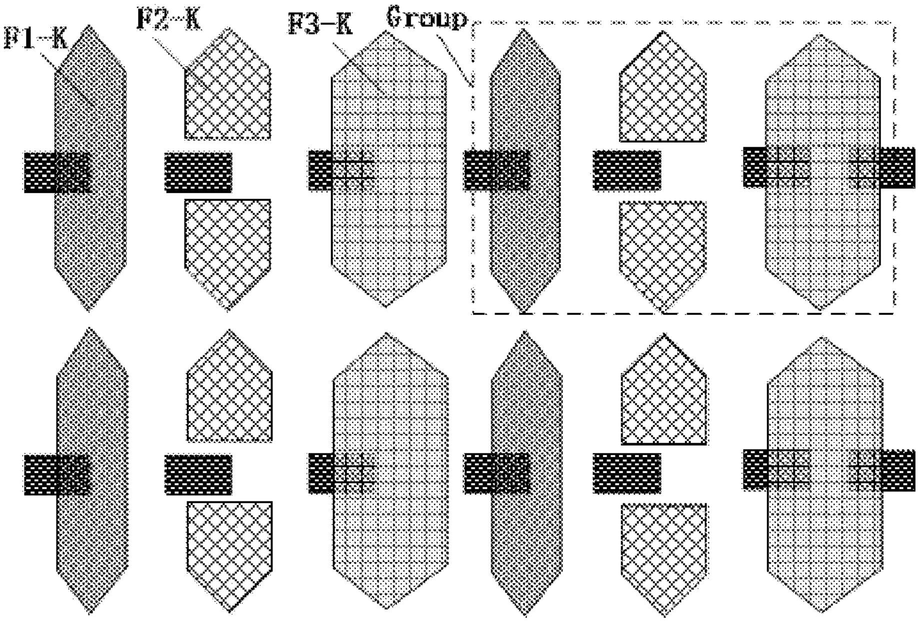

Thirdly, as shown in FIG. 11, the orthographic projections of the pixel opening regions K of the first light-emitting devices F1 on the substrate 1 partially overlap with the orthographic projection of the gate of the driving transistor DTFT on the substrate 1, the orthographic projections of the pixel opening regions K of the third light-emitting devices F3 on the substrate 1 partially overlap with the orthographic projection of the gate of the driving transistor DTFT on the substrate 1, and the orthographic projections of the pixel opening regions K of the second light-emitting devices F2 on the substrate 1 and the orthographic projection of the gate of the driving transistor DTFT on the substrate 1 are roughly non overlapping.

In the display device provided by at least one embodiment of the present application, as shown in FIG. 10, under the condition that the first light-emitting device F1 and the second light-emitting device F2 are located in the same row and are arranged alternately, the orthographic projection of the pixel opening region F3-K of the third light-emitting device F3 on the substrate 1 partially overlaps with the orthographic projection of the gate of the driving transistor on the substrate 1, and the orthographic projections of the pixel opening regions K (F1-K and F2-K) of the first light-emitting device F1 and the second light-emitting device F2 on the substrate 1 and the orthographic projection of the gate of the driving transistor on the substrate 1 are roughly non overlapping; the orthographic projection of the gates of a part of the driving transistors on the substrate 1 are located in a region between the orthographic projections of the pixel opening regions K of the first light-emitting device F1 and the second light-emitting device F2 on the substrate 1.

For example, the orthographic projection of the pixel opening region K of the blue light-emitting device on the substrate 1 partially overlaps with the orthographic projection of the gate of the driving transistor on the substrate 1, and the orthographic projections of the pixel opening regions K of the red light-emitting device and the green light-emitting device on the substrate 1 and the orthographic projection of the gate of the driving transistor on the substrate 1 are roughly non overlapping; the orthographic projection of the gates of a part of the driving transistors on the substrate 1 are located in a region between the orthographic projections of the pixel opening regions K of the red light-emitting device and the blue light-emitting device on the substrate 1.

In the display device provided by at least one embodiment of the present application, as shown in FIG. 11, under the condition that the first light-emitting device F1, the second light-emitting device F2 and the third light-emitting device F3 are arranged in sequence and are located in the same row, and the pixel opening region K of the second light-emitting device F2 includes two parts that are not connected, the orthographic projection of the pixel opening region F3-K of the third light-emitting device on the substrate 1 partially overlaps with the orthographic projection of the gate of the driving transistor on the substrate 1, the orthographic projection of the pixel opening region F1-K of the first light-emitting device on the substrate 1 partially overlaps with the orthographic projection of the gate of the driving transistor on the substrate 1, and the orthographic projections of the pixel opening regions F2-K of the second light-emitting device on the substrate 1 and the orthographic projection of the gate of the driving transistor on the substrate 1 are roughly non overlapping; the orthographic projection of the gates of a part of the driving transistors on the substrate 1 are located in a region between the orthographic projections of the two parts of the pixel opening region F2-K of the second light-emitting device on the substrate 1.

For example, the orthographic projection of the pixel opening region K of the blue light-emitting device on the substrate 1 partially overlaps with the orthographic projection of the gate of the driving transistor on the substrate 1, the orthographic projection of the pixel opening region K of the red light-emitting device on the substrate 1 partially overlaps with the orthographic projection of the gate of the driving transistor on the substrate 1, and the orthographic projections of the pixel opening regions K of the green light-emitting device on the substrate 1 and the orthographic projection of the gate of the driving transistor on the substrate 1 are roughly non overlapping; the orthographic projection of the gates of a part of the driving transistors on the substrate 1 are located in the region between the orthographic projections of the two parts of the pixel opening regions K of the green light-emitting device on the substrate 1.

In the display device provided in the embodiment of the present application, when the pixel opening rate is large (the size of the pixel opening region K is large), and the gate of the driving transistor cannot completely avoid the pixel opening region of the light-emitting device, it can set that the orthographic projections of the pixel opening regions K of a part of the light-emitting devices F on the substrate 1 partially overlap with the orthographic projection of the gate of the driving transistor DTFT on the substrate 1, and the orthographic projections of the pixel opening regions K of another part of the light-emitting devices F on the substrate 1 and the orthographic projection of the gate of the driving transistor DTFT on the substrate 1 are roughly non overlapping, which can reduce the area of the overlapping region between the gate of the driving transistor DTFT and the pixel opening region K as much as possible. In this way, the phenomenon of local heat concentration in the display device can be avoided as much as possible, which improves the heat dissipation performance of the display device. After continuously displaying the white picture at the room temperature for two hours, the temperature rise of the display surface is less than or equal to 15° C., thereby delaying its aging and extending its service life.

In the display device provided by at least one embodiment of the present application, a ratio range of areas of the pixel opening regions K of the first light-emitting device F1, the second light-emitting device F2 and the third light-emitting device F3 is (1):(1~2.5):(1.5~3.5).

For example, the ratio range of the areas of the pixel opening regions K of the first light-emitting device F1, the second light-emitting device F2 and the third light-emitting device F3 is 1:1:1.5, 1:1:2.5, 1:1.5:2.5, 1:2:2.5, 1:2:3, 1:2.5:3, 1:2.5:3, and 1:2.3:3.1.

Among them, the first light-emitting device F1 may be the red light-emitting device, the second light-emitting device F2 may be the green light-emitting device, and the third light-emitting device F3 may be the blue light-emitting device.

In exemplary embodiments, the luminescent materials of the red light-emitting device and the green light-emitting device are fluorescent materials, while the luminescent materials of the blue light-emitting devices are phosphorescent materials. The lifespan of the luminescent materials of the blue light-emitting devices is usually the shortest. In order to ensure the display effect after a long lifespan, the area of the pixel opening region of the blue light-emitting device is the largest.

Figure 12:
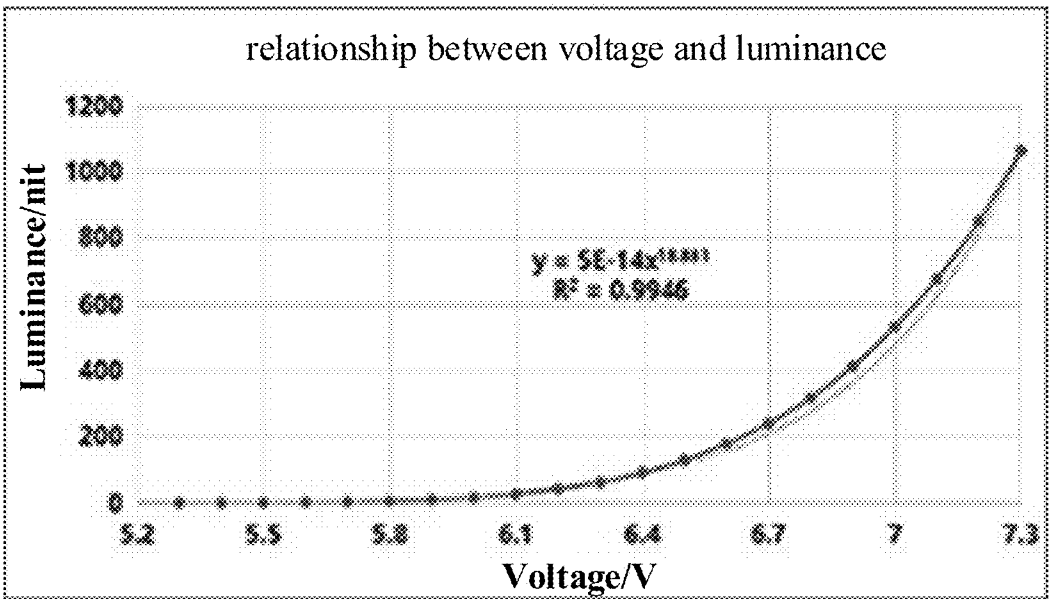
FIG. 12 is a curve chart of a voltage and luminance of a light-emitting device according to an embodiment of the present application.

In the display device provided by at least one embodiment of the present application, as shown in FIG. 12, luminance of the light-emitting device F and a driving voltage of the drive unit Q satisfy a following functional relationship:

$Y=5E-14*X^{18.851}$, where X represents the driving voltage, Y represents the luminance, a value range of X includes 4V~8V, and the driving voltage is a voltage applied to an anode AN of the light-emitting device F.

It should be noted that, the above functional relationship $Y=5E-14*X^{18.851}$ is fitted based on actual test results, where the correlation coefficient $R^2=0.9946>0.99$ in the fitted result, which indicates that the above fitting results are highly consistent with the measured data.

In the actual operation process of the light-emitting device F, the lower the luminance of the light-emitting device F, the smaller the required driving voltage, and the relationship between the luminance and the driving voltage is not linear. In the actual use process of the display device, the driving chip configures and provides different voltages (also known as cross voltage) based on the actual luminance or current requirements to achieve dynamic voltage regulation. By using the relationship between the driving voltage and the luminance in the function (curve) shown in FIG. 12 above, and dynamically adjusting the voltage according to the required luminance, the actual driving voltage during use can be further reduced. The lower the driving voltage, the smaller the electric heating effect, which is beneficial for reducing the temperature rise of the display device.

In the display device provided by at least one embodiment of the present application, as shown in FIG. 14, luminance of the light-emitting device F and a driving voltage of the drive unit Q satisfy a following piecewise function relationship:

$Y=6E-12*e^{4.7563X}$, the value range of X includes 5.8V~6.4V; $R^2=0.9951>0.99$;

$Y=2E-7*e^{3.1015X}$, the value range of X includes 6.4V~6.8V; $R^2=0.9981>0.99$;

$Y=4E-5*e^{2.3425X}$, the value range of X includes 6.8V~7.3V; $R^2=0.9988>0.99$; where X represents the driving voltage, Y represents the luminance, and the driving voltage is a voltage applied to the anode AN of the light-emitting device F.

It should be noted that, the above piecewise function relationship is fitted based on actual test results, where the correlation coefficient $R^2=0.9946>0.99$ in the fitted result, which indicates that the above fitting results are highly consistent with the measured data. Among them, the closer the correlation coefficient $R^2$ is to 1, the higher the consistency between the fitting results and the measured data.

In the actual operation process of the light-emitting device F, the lower the luminance of the light-emitting device F, the smaller the required driving voltage, and the relationship between the luminance and the driving voltage is not linear. In the actual use process of the display device, the driving chip configures and provides different voltages (also known as cross voltage) based on the actual luminance or current requirements to achieve dynamic voltage regulation. By using the relationship between the driving voltage and the luminance in the piecewise function shown in FIG. 14 above, and dynamically adjusting the voltage according to the required luminance, the actual driving voltage during use can be further reduced. The lower the driving voltage, the smaller the electric heating effect, which is beneficial for reducing the temperature rise of the display device.

In the display device provided by at least one embodiment of the present application, the display device is configured as that a ratio of minimum luminance to maximum luminance in the white picture is greater than or equal to 80%.

For example, the ratio of the minimum luminance to the maximum luminance in the white picture may be 82%, 84%, 85%, 88%, 90%, 93%, 95%, 96%, 98%.

The ratio of the minimum luminance to the maximum luminance in the white picture can represent the brightness uniformity of the display device. In practical applications, due to the presence of IR Drop (voltage drop) in the active area, the brightness of the active area near the driver chip (IC) is higher than that of other regions. By adjusting the brightness uniformity, the brightness of the regions with higher brightness can be reduced (regions with higher brightness generate more heat), thus reducing the highest temperature rise in the active area of the display device.

In exemplary embodiments, the Demura algorithm can be used to improve the brightness uniformity. For example, including optical compensation and electrical compensation. Among them, the entire process of Demura optical compensation is to first use an accurate camera, also known as an image collector, to test brightness, chromaticity and other information of the screen and analyze them. The analysis results are calculated by algorithms to determine the regions with higher brightness and the regions with lower brightness. Based on the luminance and other parameters of different regions, Demura codes are generated to compensate for the luminance, thus completing Demura optical compensation. The specific process of Demura optical compensation can refer to the introduction in related art, which will not be repeated here. Electrical compensation can usually be achieved through the design of the driving circuits, such as compensating circuits. The specific process of the electrical compensation can refer to the introduction in related art, which will not be repeated here.

In the display device provided by at least one embodiment of the present application, a range of white light efficiency of the display device is 60 cd/A~130 cd/A, and the white light efficiency refers to luminous efficiency of lights emitted by the first light-emitting device F1, the second light-emitting device F2 and the third light-emitting device F3 after mixing colors.

Optionally, the range of the white light efficiency of the display device is 90 cd/A~130 cd/A. For example, the white light efficiency of the display device may be 95 cd/A, 98 cd/A, 100 cd/A, 105 cd/A, 110 cd/A, 115 cd/A, 120 cd/A, and 125 cd/A.

In the display device provided in the embodiment of the present application, by improving the luminous efficiency of the light-emitting device, the required driving current at the same luminance is reduced, thereby reducing the heat generated in the display device. As shown in FIG. 15, it can be seen that, as the white light efficiency of the display device increases, the temperature rise of the display device significantly decreases, and the change between the white light efficiency and the temperature rise is linear. In this way, the heat generated in the display device can be minimized as much as possible. After continuously displaying the white picture at the room temperature for two hours, the temperature rise of the display surface is less than or equal to 15° C., thereby delaying its aging and extending its service life.

In the display device provided by at least one embodiment of the present application, the light-emitting device F further includes a cathode CA, a material of the cathode CA includes magnesium silver alloy, and a ratio range of magnesium and silver is 1:9~1:20.

For example, the ratio range of the magnesium and the silver in the magnesium silver alloy is 1:15, 1:16, 1:17, 1:17, 1:19, 1:20.

In the embodiment of the present application, by increasing the silver content in the cathode CA of the light-emitting device, it can greatly improve the conductivity and reduce the resistance, and thus the heat generated by the resistance can be reduced, which is beneficial for reducing the temperature rise of the display device. After continuously displaying the white picture at the room temperature for two hours, the temperature rise of the display surface is less than or equal to 15° C., thereby delaying its aging and extending its service life.

In the display device provided by at least one embodiment of the present application, the drive unit includes a source-drain metal layer SD, the source-drain metal layer SD includes a source and a drain of the driving transistor DTFT, a plurality of signal lines and a plurality of connecting wirings; and a thickness range of the source-drain metal layer SD along a direction perpendicular to the substrate 1 is 600 nm~1000 nm, and preferably, the thickness range may be 800 nm~1000 nm.

For example, the signal lines may include data lines Data.

For example, the connecting wirings may include wirings between the driving transistor DTFT and the storage capacitor Cst, and wirings between the driving transistor DTFT and other switch transistors.

For example, the thickness of the source-drain metal layer SD along the direction perpendicular to the substrate 1 may be 850 nm, 900 nm, 950 nm, 980 nm, 1000 nm.

In the embodiment of the present application, because the source-drain metal layer SD is provided with the plurality of signal lines and the plurality of connecting wirings, by increasing the thickness of the source-drain metal layer SD and setting its thickness range as 600 nm~1000 nm, it can greatly improve the conductivity and reduce the resistance, and thus the heat generated by the resistance can be reduced, which is beneficial for reducing the temperature rise of the display device. After continuously displaying the white picture at the room temperature for two hours, the temperature rise of the display surface is less than or equal to 15° C., thereby delaying its aging and extending its service life.

Figure 18:
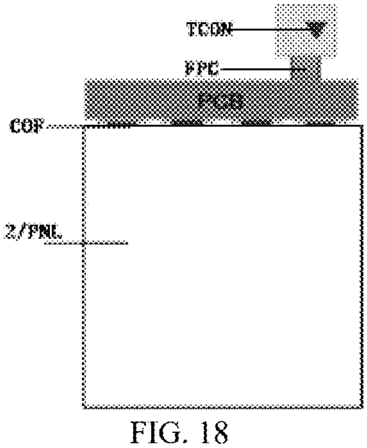
FIG. 18 to FIG. 20 are schematic structural diagrams of three types of display devices according to embodiments of the present application.

In the display device provided by at least one embodiment of the present application, as shown in FIG. 18, the display device further includes a printed circuit board PCB and a control board TCON, the printed circuit board PCB and the control board TCON are electrically connected to the drive unit Q, and both orthographic projections of the printed circuit board PCB and the control board TCON on the substrate 1 do not overlap with an orthographic projection of the light-emitting device F on the substrate 1.

For example, The control board TCON, also known as a timing controller, is used to provide timing signals and control signals.

For example, the control board TCON is electrically connected to the printed circuit board PCB through a flexible printed circuit FPC, and the printed circuit board PCB is electrically connected to the display panel PNL through a coated film COF.

Figure 17:
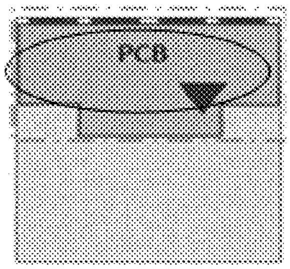
FIG. 17 is a schematic structural diagram of a back surface of the display device in FIG. 16.

In related art, as shown in FIG. 17, the printed circuit board PCB is usually placed on the back of the active area of the display panel, and even the control board TCON is integrated on the printed circuit board PCB. In this way, the orthographic projection of the printed circuit board PCB on the substrate 1 of the display device overlaps with the orthographic projection of the light-emitting device F on the substrate 1, both of which generate heat, causing the heat to accumulate in the region marked by the elliptical circle in FIG. 16. The heat is concentrated in this region, causing the temperature rise of the display device to exceed 22° C. after continuously displaying for 2 hours in the white picture, which seriously affects the heat dissipation of the display device and accelerating its aging speed.

Figure 19:
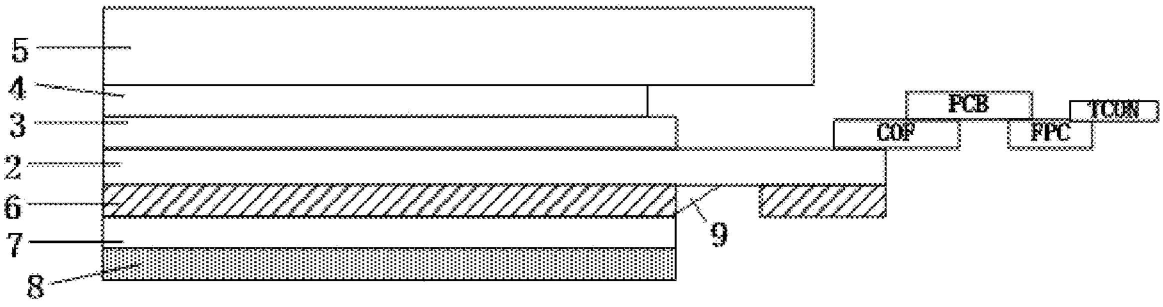

In the display device provided by the embodiment of the present application, referring to FIG. 18 and FIG. 19, by setting up the printed circuit board PCB and the control board TCON which are independent, and setting that the orthographic projections of the printed circuit board PCB and the control board TCON on the substrate 1 do not overlap with the orthographic projection of the light-emitting device F on the substrate 1, it disperses heat to a large extent, thus avoiding heat concentration and making it difficult to dissipate heat, which is beneficial for reducing the temperature rise of the display device. After continuously displaying the white picture at the room temperature for two hours, the temperature rise of the display surface is less than or equal to 15° C., thereby delaying its aging and extending its service life.

Figure 20:
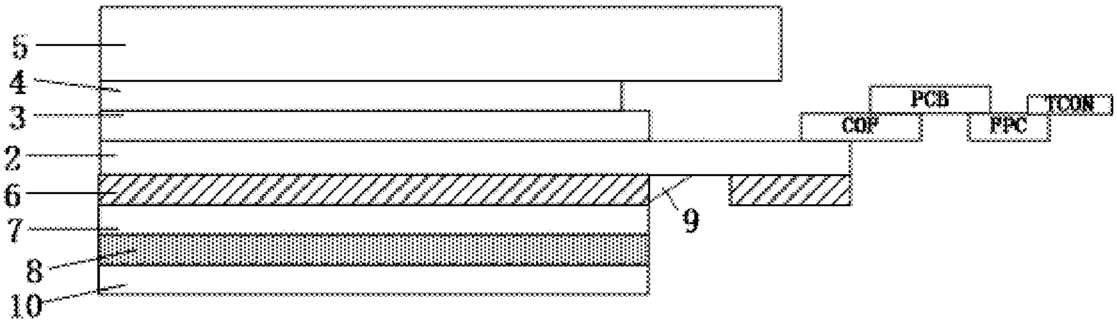

In the display device provided by at least one embodiment of the present application, as shown in FIG. 20, the display device further includes a backsheet 6, a thermal conductive bonding layer 7, a graphene heat sink 8 and a liquid-cooled heat dissipation layer 10. The backsheet 6 is located at a side of the substrate 1 away from the drive unit Q (the display device includes a display panel 2, and the display panel 2 includes the substrate 1 and the drive unit Q, the thermal conductive bonding layer 7 is located at a side of the backsheet 6 away from the substrate 1, the graphene heat sink 8 is located at a side of the thermal conductive bonding layer 7 away from the substrate 1, the liquid-cooled heat dissipation layer 10 is located at a side of the graphene heat sink 8 away from the substrate 1, and the liquid-cooled heat dissipation layer 10 includes at least one of mineral oil and hydrofluoroether.

Among them, the backsheet 6 is used to provide protection for the display panel 2. On the one hand, the thermal conductive bonding layer 7 improves heat dissipation, and on the other hand, it is bonded with the graphene heat sink 8.

For example, the material of the thermal conductive bonding layer 7 can be thermal conductive adhesive.

Figure 13:
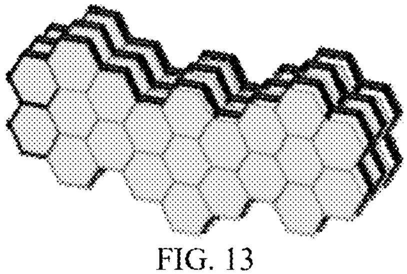
FIG. 13 is a schematic structural diagram of a graphene heat sink according to an embodiment of the present application.

For example, the material of the graphene heat sink 8 includes graphene. FIG. 13 shows a schematic structural diagram of the graphene heat sink 8, the thickness range of the graphene heat sink 8 is 0.1 mm~0.5 mm, for example, its thickness can be set to 0.4 mm, which can play a role in heat dissipation and support.

Figure 21:
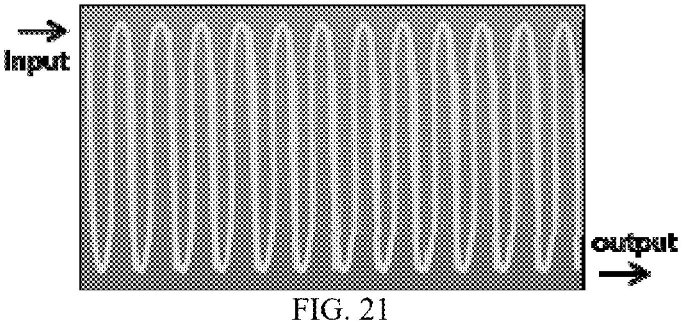
FIG. 21 to FIG. 23 are layout diagrams of condensers of three types of liquid-cooled heat dissipation layers according to embodiments of the present application.
Figure 22:
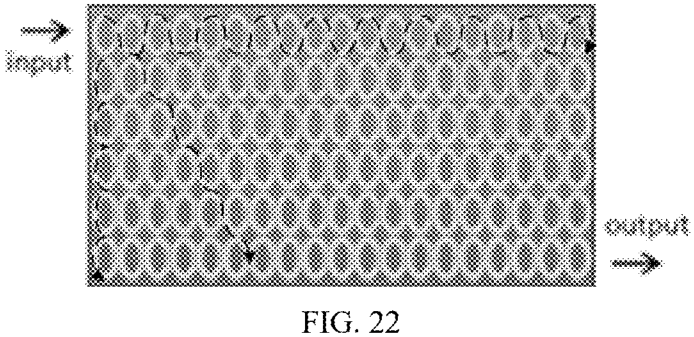
Figure 23:
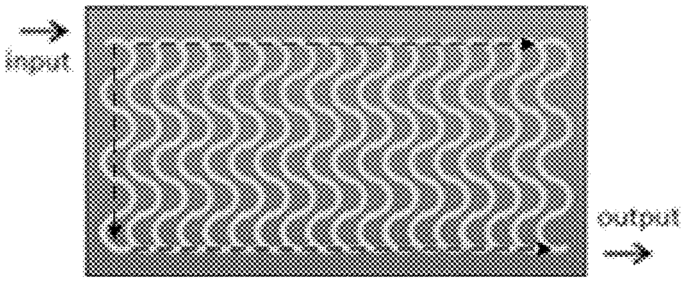

For example, condensation tubes as shown in FIG. 21, 22 or 23 can be provided in the liquid-cooled heat dissipation layer 10. Certainly, the condensation tubes in the liquid-cooled heat dissipation layer 10 can also be arranged in other ways, which is not limited here. The liquid in the condenser tubes shown in FIG. 21, 22 or 23 can flow in the direction indicated by the arrows in their respective diagrams, or in other ways. This is only an example and does not represent a limitation on the liquid-cooled heat dissipation layer 10.

The display device may also include a support portion 9, a polarizer 3, an optical adhesive (OCA) 4, and a cover plate 5 as shown in FIG. 20. Certainly, the display device may also include other structures and components. The other structures and components included in the display device can refer to the introduction in related art, which will not be repeated here.

In the embodiment of the present application, by setting the thermal conductive bonding layer 7, the graphene heat sink 8, and the liquid-cooled heat dissipation layer 10, the heat dissipation performance of the display device can be further improved, which is beneficial for reducing the temperature rise of the display device. After continuously displaying the white picture at the room temperature for two hours, the temperature rise of the display surface is less than or equal to 15° C., thereby delaying its aging and extending its service life.

Figure 24:
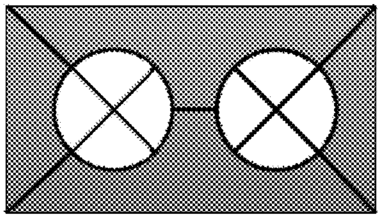
FIG. 24 is a schematic structural diagram of an air-cooled radiator of a driving tool according to an embodiment of the present application.

The embodiment of the present application provides a driving tool, the driving tool includes the display device described above, the driving tool further includes an air-cooled radiator as shown in FIG. 24, and the air-cooled radiator is located at a side of the display device away from the display surface.

For example, the driving tool may include cars.

For example, the air-cooled radiator may include a fan.

The specific structure of the display device included in the above driving tool can be referred to the previous introduction, and will not be repeated here.

The usage environment of onboard display devices is complex and may often be exposed to direct sunlight. In addition, due to the high brightness of ambient light when using the onboard display devices, compared to other electronic devices, the onboard display devices often require higher display brightness, these factors all lead to the display device generating higher heat, thereby accelerating the aging of the display device. The display device provided in the embodiments of the present application avoids heat concentration as much as possible, improves heat dissipation performance, and is conducive to reducing the temperature rise of the display device. After continuously displaying the white picture at the room temperature for two hours, the temperature rise of the display surface is less than or equal to 15° C., thereby delaying its aging and extending its service life. When the display device is applied to the driving tool, it can greatly improve the quality of the driving tool and enhance the user experience.

The above is only a specific implementation of the present application, but the scope of protection of the present application is not limited to this. Any person skilled in the art within the scope of the disclosed technology can easily think of changes or replacements, which should be covered within the scope of protection of the present application. Therefore, the scope of protection of the present application shall be based on the scope of protection of the claims.

The invention claimed is:

1. A display device comprising a substrate and a plurality of sub-pixels arranged in an array on the substrate, wherein each of the plurality of sub-pixels comprises:

a drive unit located at one side of the substrate, wherein the drive unit comprises a driving transistor and a storage capacitor that are electrically connected; and light-emitting devices electrically connected to the drive unit, wherein each of the light-emitting devices comprises a pixel opening region, an orthographic projection of the pixel opening region on the substrate and an orthographic projection of the driving transistor on the substrate are at least partially non overlapping, and the orthographic projection of the pixel opening region on the substrate and an orthographic projection of the storage capacitor on the substrate are at least partially non overlapping, wherein the display device is configured as that, after continuously displaying a white picture at room temperature for two hours, a temperature rise of a display surface of the display device is less than or equal to 15° C., wherein a luminance of a light source of the display device is greater than or equal to 500 nit, wherein the light-emitting devices comprise a plurality of light-emitting device groups, and each of the plurality of light-emitting device groups comprises a first light-emitting device, a second light-emitting device and a third light-emitting device, and wherein a ratio range of areas of the pixel opening regions of the first light-emitting device, the second light-emitting device and the third light-emitting device is (1):(1~2.5):(1.5~3.5).

2. The display device according to claim 1, wherein the driving transistor comprises an active layer, and the orthographic projection of the pixel opening region on the substrate and an orthographic projection of the active layer of the driving transistor on the substrate are at least partially non overlapping.

3. The display device according to claim 1, wherein the driving transistor comprises a gate, and the orthographic projection of the pixel opening region on the substrate and an orthographic projection of the gate of the driving transistor on the substrate are at least partially non overlapping.

4. The display device according to claim 3, wherein the first light-emitting device and the second light-emitting device are located in the same row and are arranged alternately, and a shape formed by connecting lines of geometric centers of the pixel opening regions of the first light-emitting device, the second light-emitting device and the third light-emitting device is a triangle; or the first light-emitting device, the second light-emitting device and the third light-emitting device are arranged in sequence and are located in the same row, the pixel opening region of the second light-emitting device comprises two parts that are not connected, the geometric centers of the pixel opening regions of the first light-emitting device, the second light-emitting device and the third light-emitting device are collinear.

5. The display device according to claim 4, wherein the orthographic projection of the pixel opening region of the light-emitting device on the substrate and the orthographic projection of the gate of the driving transistor on the substrate are roughly non overlapping.

6. The display device according to claim 5, wherein a plurality of light-emitting device groups extending along a first direction form a row, the gates of the driving transistors are all located between two adjacent rows of the light-emitting device groups, an arrangement direction of the gates of the driving transistors electrically connected to the light-emitting device groups of the same row is consistent with the first direction.

7. The display device according to claim 5, wherein under the condition that the first light-emitting device and the second light-emitting device are located in the same row and are arranged alternately, a range of a percentage of an area of a region, where the orthographic projection of the pixel opening region of the light-emitting device on the substrate overlaps with an orthographic projection of other regions of the driving transistor except for the gate on the substrate, to an area of the pixel opening region is 17%~37%;

a range of a percentage of an area of a region, where the orthographic projection of the pixel opening region of the light-emitting device on the substrate overlaps with an orthographic projection of the storage capacitor on the substrate, to the area of the pixel opening region is 17%~37%.

8. The display device according to claim 5, wherein under the condition that the first light-emitting device, the second light-emitting device and the third light-emitting device are arranged in sequence and are located in the same row, and the pixel opening region of the second light-emitting device comprises two parts that are not connected, a range of a percentage of an area of a region, where the orthographic projection of the pixel opening region of the light-emitting device on the substrate overlaps with an orthographic projection of other regions of the driving transistor except for the gate on the substrate, to an area of the pixel opening region is 24%~44%;

a range of a percentage of an area of a region, where the orthographic projection of the pixel opening region of the light-emitting device on the substrate overlaps with an orthographic projection of the storage capacitor on the substrate, to the area of the pixel opening region is 24%~44%.

9. The display device according to claim 4, wherein the orthographic projections of the pixel opening regions of a part of the light-emitting devices on the substrate partially overlap with the orthographic projection of the gate of the driving transistor on the substrate, and the orthographic projections of the pixel opening regions of another part of the light-emitting devices on the substrate and the orthographic projection of the gate of the driving transistor on the substrate are roughly non overlapping.

10. The display device according to claim 9, wherein under the condition that the first light-emitting device and the second light-emitting device are located in the same row and are arranged alternately, an orthographic projection of the pixel opening region of the third light-emitting device on the substrate partially overlaps with the orthographic projection of the gate of the driving transistor on the substrate, and the orthographic projections of the pixel opening regions of the first light-emitting device and the second light-emitting device on the substrate and the orthographic projection of the gate of the driving transistor on the substrate are roughly non overlapping;

the orthographic projection of the gates of a part of the driving transistors on the substrate are located in a region between the orthographic projections of the pixel opening regions of the first light-emitting device and the second light-emitting device on the substrate.

11. The display device according to claim 9, wherein under the condition that the first light-emitting device, the second light-emitting device and the third light-emitting device are arranged in sequence and are located in the same row, and the pixel opening region of the second light-emitting device comprises two parts that are not connected, an orthographic projection of the pixel opening region of the third light-emitting device on the substrate partially overlaps with the orthographic projection of the gate of the driving transistor on the substrate, an orthographic projection of the pixel opening region of the first light-emitting device on the substrate partially overlaps with the orthographic projection of the gate of the driving transistor on the substrate, and the orthographic projections of the pixel opening regions of the second light-emitting device on the substrate and the orthographic projection of the gate of the driving transistor on the substrate are roughly non overlapping;

the orthographic projection of the gates of a part of the driving transistors on the substrate are located in a region between the orthographic projections of the two parts of the pixel opening region of the second light-emitting device on the substrate.

12. A display device comprising a substrate and a plurality of sub-pixels arranged in an array on the substrate, wherein each of the plurality of sub-pixels comprises:

a drive unit located at one side of the substrate, wherein the drive unit comprises a driving transistor and a storage capacitor that are electrically connected; and light-emitting devices electrically connected to the drive unit, wherein each of the light-emitting devices comprises a pixel opening region, an orthographic projection of the pixel opening region on the substrate and an orthographic projection of the driving transistor on the substrate are at least partially non overlapping, and the orthographic projection of the pixel opening region on the substrate and an orthographic projection of the storage capacitor on the substrate are at least partially non overlapping, wherein the display device is configured as that, after continuously displaying a white picture at room temperature for two hours, a temperature rise of a display surface of the display device is less than or equal to 15° C., wherein a luminance of a light source of the display device is greater than or equal to 500 nit, and wherein luminance of the light-emitting device and a driving voltage of the drive unit satisfy a following functional relationship:

$Y=5E-14*X^{18.851}$, wherein X represents the driving voltage, Y represents the luminance, a value range of X comprises 4V~8V, and the driving voltage is a voltage applied to an anode of the light-emitting device.

13. A display device comprising a substrate and a plurality of sub-pixels arranged in an array on the substrate, wherein each of the plurality of sub-pixels comprises:

a drive unit located at one side of the substrate, wherein the drive unit comprises a driving transistor and a storage capacitor that are electrically connected; and light-emitting devices electrically connected to the drive unit, wherein each of the light-emitting devices comprises a pixel opening region, an orthographic projection of the pixel opening region on the substrate and an orthographic projection of the driving transistor on the substrate are at least partially non overlapping, and the orthographic projection of the pixel opening region on the substrate and an orthographic projection of the storage capacitor on the substrate are at least partially non overlapping, wherein the display device is configured as that, after continuously displaying a white picture at room temperature for two hours, a temperature rise of a display surface of the display device is less than or equal to 15° C., wherein a luminance of a light source of the display device is greater than or equal to 500 nit, and wherein luminance of the light-emitting device and a driving voltage of the drive unit satisfy a following piecewise function relationship:

$Y=6E-12*e^{4.7563X}$, a value range of X comprises 5.8V~6.4V;

$Y=2E-7*e^{3.1015x}$, the value range of X comprises 6.4V~6.8V;

$Y=4E-5*e^{2.3425X}$, the value range of X comprises 6.8V~7.3V; wherein X represents the driving voltage, Y represents the luminance, and the driving voltage is a voltage applied to an anode of the light-emitting device.

14. The display device according to claim 1, wherein the display device is configured as that a ratio of minimum luminance to maximum luminance in a white picture is greater than or equal to 80%.

15. The display device according to claim 11, wherein a range of white light efficiency of the display device is 60 cd/A~130 cd/A, and the white light efficiency refers to luminous efficiency of lights emitted by the first light-emitting device, the second light-emitting device and the third light-emitting device after mixing colors.

16. The display device according to claim 1, wherein the light-emitting device further comprises a cathode, a material of the cathode comprises magnesium silver alloy, and a ratio range of magnesium and silver is 1:9~1:20.

17. The display device according to claim 1, wherein the drive unit comprises a source-drain metal layer, the source-drain metal layer comprises a source and a drain of the driving transistor, a plurality of signal lines and a plurality of connecting wirings; wherein a thickness range of the source-drain metal layer along a direction perpendicular to the substrate is 600 nm~1000 nm.

18. The display device according to claim 1, wherein the display device further comprises a printed circuit board and a control board, the printed circuit board and the control board are electrically connected to the drive unit, and both orthographic projections of the printed circuit board and the control board on the substrate do not overlap with an orthographic projection of the light-emitting device on the substrate.

19. A driving tool, wherein the driving tool comprises the display device according to claim 1, the driving tool further comprises an air-cooled radiator, and the air-cooled radiator is located at a side of the display device away from the display surface.

* * * * *